United States Patent
Laurent et al.

(10) Patent No.: US 11,733,913 B2
(45) Date of Patent: Aug. 22, 2023

(54) BALANCING DATA FOR STORAGE IN A MEMORY DEVICE

(71) Applicant: Micron Technology, Inc., Boise, ID (US)

(72) Inventors: Christophe Vincent Antoine Laurent, Agrate Brianza (IT); Andrea Martinelli, Bergamo (IT); Marco Sforzin, Cernusco Sul Naviglio (IT); Paolo Amato, Treviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/677,586

(22) Filed: Feb. 22, 2022

(65) Prior Publication Data

US 2022/0253237 A1 Aug. 11, 2022

Related U.S. Application Data

(63) Continuation of application No. 16/865,163, filed on May 1, 2020, now Pat. No. 11,262,937.

(51) Int. Cl.
*G06F 3/06* (2006.01)

(52) U.S. Cl.
CPC .......... *G06F 3/0655* (2013.01); *G06F 3/0602* (2013.01); *G06F 3/0673* (2013.01)

(58) Field of Classification Search
None
See application file for complete search history.

(56) References Cited

U.S. PATENT DOCUMENTS

| | | |
|---|---|---|
| 10,566,052 B2 | 2/2020 | Mirichigni et al. |
| 10,892,776 B1 | 1/2021 | Kuo |
| 2016/0371198 A1 | 12/2016 | Cui et al. |
| 2017/0061012 A1 | 3/2017 | Bortnikov et al. |
| 2017/0230143 A1 | 8/2017 | Regev et al. |
| 2018/0060612 A1 | 3/2018 | Gladwin et al. |

(Continued)

FOREIGN PATENT DOCUMENTS

WO 93/23806 A1 11/1993

OTHER PUBLICATIONS

International Search Report and Written Opinion received for PCT Patent Application No. PCT/US21/27313, dated Aug. 5, 2021, 8 pages.

(Continued)

*Primary Examiner* — Charles J Choi
(74) *Attorney, Agent, or Firm* — Holland & Hart LLP

(57) ABSTRACT

Methods, systems, and devices related to balancing data are described. Data may be communicated using an original set of bits that may be partitioned into segments. Each of the original set of bits may have a first value or a second value, where a weight of the original set of bits may be based on a quantity of the set of bits that have the first value. If the weight of the original set of bits is outside of a target weight range, a different, encoded set of bits may be used to represent the data, the encoded set of bits having a weight within the target weight range. The encoded set of bits may be identified based an inversion of the original set of bits in a one-at-a-time and cumulative fashion. The encoded set of bits may be stored in place of the original set of bits.

20 Claims, 11 Drawing Sheets

(56) References Cited

U.S. PATENT DOCUMENTS

2019/0354479 A1  11/2019  Pawlowski
2021/0132905 A1*  5/2021  Ware ..................... G06F 7/5443

OTHER PUBLICATIONS

ISA/KR, International Search Report and Written Opinion of the International Searching Authority, Int'l Appl. No. PCT/US2021/07313, dated Aug. 5, 2021, Korean Intellectual property Office, Seo-gu, Daejeon, Republic of Korea, 10 pgs.

* cited by examiner

BALANCING DATA FOR STORAGE IN A MEMORY DEVICE

CROSS REFERENCE

The present Application for Patent is a continuation of U.S. patent application Ser. No. 16/865,163 by Laurent et al., entitled "BALANCING DATA FOR STORAGE IN A MEMORY DEVICE," filed May 1, 2020, assigned to the assignee hereof, and is expressly incorporated by reference in its entirety herein.

BACKGROUND

The following relates generally to one or more memory systems and more specifically to balancing data for storage in a memory device.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

Improving memory devices may include increasing memory cell density, increasing read/write speeds, increasing reliability, increasing data retention, reducing power consumption, or reducing manufacturing costs, among other metrics.

DETAILED DESCRIPTION

Figure 1:
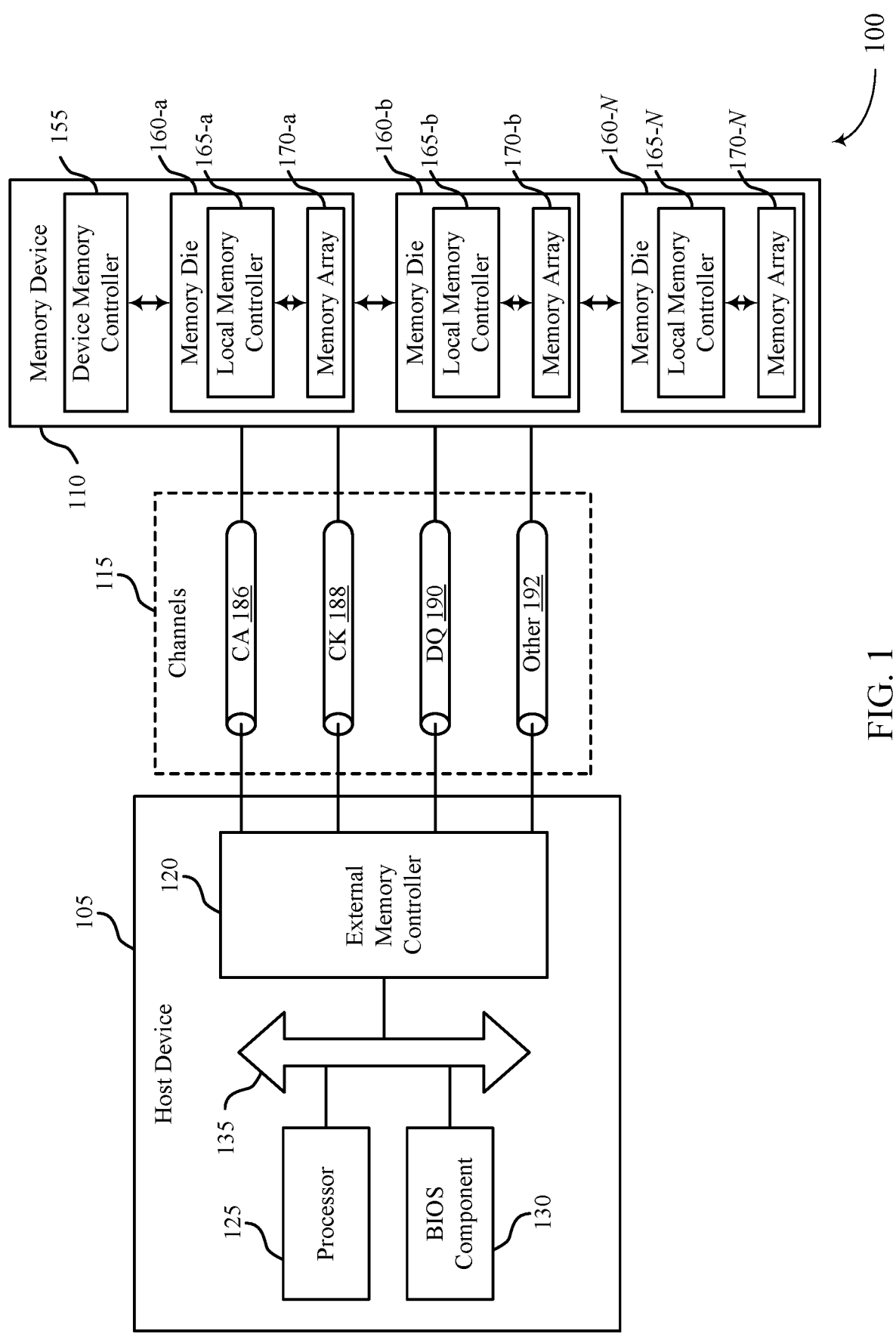
FIG. 1 illustrates an example of a system that supports balancing data for storage in a memory device in accordance with examples as disclosed herein.

A set of data (data packet, data burst) that is exchanged between a host device and memory device may include N bits, where each of the N bits may represent a logic value (e.g., one of a first logic value or a second logic value). A weight may be assigned to a data packet based on a quantity of bits included in the data packet that have a first logic value (e.g., 1). A data packet that has a same quantity of bits having the first logic value and a second logic value (e.g., 0) may be referred to as a "balanced data packet" or balanced codeword," and a data packet having a specific weight (e.g., a weight of $$\frac{N}{2}$$

or some other specific target weight) may be more generally referred to as a "constant weight data packet" or "constant weight codeword." As described herein, a data packet may be encoded to have a specific target weight (e.g., to be a balanced data packet or another type of constant weight data packet) or to have a weight that is within a target weight range (e.g., a weight within the range $$\left[\frac{N}{2}, \frac{N}{2}+i\right]\right).$$

Thus, an encoded data packet as used herein may broadly refer to a packet that is a balanced data packet, a constant weight data packet, or a data packet with a weight within a target weight range. Such encoded data packets may support at least one of advanced read techniques, lower latencies, increased reliability, lower power consumption, and reduced leakage within a memory array, among other benefits that may be appreciated by one of ordinary skill in the art. A process by which a data packet is encoded to achieve a weight equal to a target weight or within a target weight range may broadly be referred to herein as a balancing process, even if the resulting encoded data packet is not itself strictly balanced, as such a process may nevertheless reduce a difference between a quantity of bits having one logic value and a quantity of bits having another logic value within the data packet.

Data packets may be encoded to obtain corresponding encoded data packets, and the encoded data packets may then be stored in a memory array. That is, encoded data packets may be used to represent the same data as the corresponding original data packets and may be stored in a memory array in place of the corresponding original data packets. In some cases, the encoding may be performed to achieve a target weight (e.g., a weight of $$\frac{N}{2}).$$

In other cases, the encoding may be performed to achieve a target weight range (e.g., a weight within the range $$\left[\frac{N}{2},\frac{N}{2}+l\right]).$$

In some cases, to obtain an encoded data packet, different inversion possibilities may be tested for a data packet. For example, for a single data packet, multiple weights may be computed for a set of possible encoded data packets that may be constructed from the single data packet, where each of the possible encoded data packets may include a different combination of inverted and noninverted bits of the data packet. To test all of the possible encoded data packets for a single data packet and to ensure that desired weight will be obtained, up to $2^N$ weights may be computed for up to $2^N$ different encoded data packets. After identifying an inversion possibility that is associated with an encoded data packet having a particular combination of inverted and noninverted bits (e.g., equal to a target weight, within a target weight range), the corresponding bits of the data packet may be inverted to yield the encoded data packet. The encoded data packet may then be stored in a memory array in place of the original data packet. To support a later decoding of the encoded data packet that returns the original data packet, encoding bits that indicate which bits of the data packet were/are inverted as a result of the encoding process may be appended to the encoded data packet. To support indicating up to $2^N$ different combinations, N encoding bits may be used to indicate which bits of the data packet were/are inverted.

In some cases, an encoding process used to generate an encoded data packet may result in increased latency for the storage of data—e.g., based on testing up to $2^N$ possible encoded data packets. To reduce the latency impact of generating encoded data packets, the number of possible encoded data packets tested may be reduced. To reduce the number of possible encoded data packets that are tested, a data packet may be divided into r segments and weights of possible encoded data packets that are derived in accordance with a sequential and cumulative (or persistent) inversion of each segment of a data packet may be checked until a target weight range is achieved. That is, the memory device may compute a first weight associated with a first possible encoded data packet assuming a first segment of the data packet is inverted, a second weight associated with a second possible encoded data packet assuming the first segment and a second segment of the data packet are inverted, up to an rth weight associated with a final possible encoded data packet assuming all of the segments of the data packet are inverted. Thus, r+1 hypotheses (rather than $2^N$ hypotheses) may be tested and $\lceil \log_2 (r+1) \rceil$ encoding bits (rather than N encoding bits) may be used to indicate which segments of the data packet were inverted during the encoding process— or, in some cases, such as when a target weight range is symmetric with respect to $$\frac{N}{2},$$

r hypotheses may be tested and $\lceil \log_2 (r+1) \rceil$ encoding bits may be used.

Depending on the bounds (e.g., lower limit, upper limit, span) of the target weight range, a weight of the possible encoded data packets derived in accordance with a sequential and cumulative inversion of segments may fail to identify an encoded data packet that achieves the target weight range. Thus, the bounds of the target weight range may be selected to ensure that a weight associated with at least one of the possible encoded data packets will fall within the target weight range may be used. For example, a target weight range may be represented as $$\left[\frac{N}{2},\frac{N}{2}\left(1+\frac{2}{r}-\frac{2}{N}\right)\right].$$

Features of the disclosure are initially described in the context of memory systems and dies as described with reference to FIGS. 1 and 2. Features of the disclosure are described in the context of data packets, inversion diagrams, memory devices, encoders, and index decoders as described with reference to FIGS. 3 through 8. These and other features of the disclosure are further illustrated by and described with reference to an apparatus diagram and flowcharts that relate to balancing data for storage in a memory device as described with reference to FIGS. 9 through 11.

FIG. 1 illustrates an example of a system 100 that supports balancing data for storage in a memory device in accordance with examples as disclosed herein. It should be noted the following is just one example of how balancing data for storage in a memory device may be implemented. The techniques disclosed herein may be implemented with any memory device. For example, the techniques disclosed herein may be implemented with FeRAM, PCM, and the like. In this example, the system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory device 110 may receive data or commands or both from the host device 105. For example, the memory device 110 may receive a write command from a host device indicating that the memory device 110 is to store a set of data for the host device 105 or a read command indicating that the memory device 110 is to provide data stored in a memory die 160 to the host device. The set of data may be sent over the data channels 190. In some cases, the set of data sent over the data channel 190 may be referred to as a data packet.

A data packet received by the memory device 110 may include N bits, where each of the N bits may have a respective logic value (e.g., either a first logic value or a second logic value). The memory device 110 may assign a weight to a data packet based on a quantity of bits included in the data packet that have the first logic value (e.g., 1)—that is, based on the number of 1s included in the data packet. As described herein, an encoded data packet may be generated based on a data packet, where the encoded data packet may have a weight that is within a target weight range or is equal to a specific target weight, which may support one or more of advanced read techniques, lower latencies, increased reliability, lower power consumption, and reduced leakage for a memory array 170, among other benefits that may be appreciated by one of ordinary skill in the art.

In one example of an advanced read technique supported by an encoded data packet, the memory device 110 may end a read operation before reading all of the memory cells used to store an encoded data packet. That is, when an encoded data packet having a specific weight (e.g., $$\frac{N}{2}\bigg)$$

is subject to a read operation, the memory device 110 may end the read operation upon determining an expected number of bits having a given logic value (e.g., $$\frac{N}{2} \text{ bits}\bigg)$$

have been read. In another example of an advanced read technique, the memory device 110 may use auto-referenced read techniques to read a set of memory cells used to store an encoded data packet. That is, the memory device 110 may determine threshold voltages (or an average threshold voltage) for the set of memory cells with increased accuracy based on storing the encoded data packet in the set of memory cells. The memory device may then use the determined threshold voltages (e.g., or average threshold voltage) to increase a reliability of read data from those memory cells.

In some cases, as part of an encoding process to obtain an encoded data packet, the memory device 110 may test different inversion possibilities for a data packet. That is, for a single data packet, the memory device 110 may compute weights for a set of possible encoded data packets that may be derived from the single data packet. Each of the possible encoded data packets may include a different combination of inverted bits and be referred to as a "hypothesis." To test all of the possible encoded data packets for a single data packet and to ensure that target weight or weight range will be obtained, the memory device 110 may compute up to $2^N$ weights for up to $2^N$ different encoded data packets derived from the single data packet—that is, the memory device 110 may test $2^N$ different hypotheses.

After identifying a hypothesis that is associated with a target weight or weight range, the memory device 110 may invert the corresponding bits of the data packet to yield the encoded data packet. The memory device 110 may then store the encoded data packet in a memory array 170 in place of the originally received data packet. To enable reconstruction of the original data packet, the memory device 110 may generate and store an indication of which bits of the data packet were inverted to form the encoded data packet—such an indication, which may alternatively be referred to as a set of encoding bits, may be appended to the encoded data packet. In some cases, $\log_2(2^N)=N$ encoding bits are used to indicate which bits of the data packet were inverted during the encoding process.

In some cases, an encoding process to obtain an encoded data packet may add latency into the process for storing data—e.g., as a result of testing up to $2^N$ different hypotheses. To reduce the added latency, the potential number of hypotheses tested by memory device 100 may be reduced. In one option for reducing the number of tested hypotheses, the memory device 110 may test a set of hypotheses that are derived in accordance with a sequential and cumulative (or persistent) inversion of each bit of a data packet until a hypothesis that achieves a target weight (e.g., a weight of $$\frac{N}{2}\bigg)$$

is determined. That is, the memory device 110 may compute a first weight associated with a first hypothesis assuming a first bit of the data packet is inverted, a second weight associated with a second hypothesis assuming the first bit and a second bit of the data packet are inverted, up to an Nth weight associated with a final hypothesis assuming all of the bits of the data packet are inverted. Thus, an encoding process that uses bit-by-bit inversion may test N+1 hypotheses (rather than $2^N$ hypotheses) and use $\lceil \log_2(N+1) \rceil$ encoding bits (rather than N encoding bits) to indicate which bits of the data packet were inverted during the encoding process. The sequential and cumulative inversion of each bit may be associated with a Knuth balancing algorithm.

In another option for reducing the number of tested hypotheses, the memory device 110 may divide a data packet into $r_1$ segments and test all of the possible combinations of inverted segments of the data packet until a hypothesis that achieves a target weight range is determined. The target weight range may be represented as $$\left[\frac{N}{2}, \frac{N}{2}\left(1 + \frac{1}{r_1}\right)\right]$$

or, alternatively, as $$\left[\frac{1}{2}, \frac{1}{2}\left(1 + \frac{1}{r_1}\right)\right]$$

after normalization. Thus, an encoding process that uses segmented inversion may test $2^{r_1}$ hypotheses (rather than $2^N$ hypotheses) and use $\log_2(2^{r_1}) = r_1$ encoding bits (rather than N encoding bits) to indicate which segments of the data packet were inverted during the encoding process, where N may be greater than $r_1$. In some cases, each of the $r_1$ segments may include $n_1$ bits, where $$n_1 = \frac{N}{r_1}.$$

In a third option for reducing the number of tested hypothesis, which may be associated with decreased latency and encoding overhead relative to the first and second options, the memory device 110 may divide a data packet into $r_2$ segments and test a set of hypotheses that are derived in accordance with a sequential and cumulative inversion of each segment of a data packet until a hypothesis that achieves a target weight range is determined. That is, the memory device may compute a first weight associated with a first hypothesis assuming a first segment of the data packet is inverted, a second weight associated with a second hypothesis assuming the first segment and a second segment of the data packet are inverted, up to an $r_2$th weight associated with a final hypothesis assuming all of the segments of the data packet are inverted. Thus, $r_2+1$ hypotheses may be tested (including a hypothesis that assumes no segments are inverted) and $\lceil \log_2(r_2+1) \rceil$ encoding bits may be used to indicate which segments of the data packet were inverted during the encoding process. In some cases, each of the $r_2$ segments may include $n_2$ bits, where $$n_2 = \frac{N}{r_2}.$$

In other cases, each of the $r_2$ segments may include a varying number of bits.

By contrast, for the first option, N+1 hypotheses may be tested and $\lceil \log_2(N+1) \rceil$ encoding bits may be used, where N may be greater than $r_2$ and $r_1$. And, for the second option, $2^{r_1}$ hypotheses may be tested and $r_1$ encoding bits may be used. In some cases, in relation to the second option, the third option may use twice the number of segments as the second option—that is $r_2$ may equal $2r_1$. The sequential and cumulative inversion of each segment may be associated with a generalized Knuth balancing algorithm. However, in some cases, the sequential and cumulative inversion of segments of a data packet may fail to identify an encoded data packet with a weight equal to a target weight or within a target weight range.

Thus, to ensure that the sequential and cumulative inversion of segments yields an encoded data packet of an acceptable weight, the memory device 110 may use a target weight range that guarantees a weight associated with at least one of the hypotheses will fall within the target weight range. The target weight range may be represented as $$\left[\frac{N}{2}, \frac{N}{2}\left(1 + \frac{2}{r_2} - \frac{2}{N}\right)\right]$$

or, alternatively, as $$\left[\frac{1}{2}, \frac{1}{2}\left(1 + \frac{2}{r_2} - \frac{2}{N}\right)\right]$$

after normalization. In some examples, a span of the target weight range may be configured to be equal to or larger than a quantity of bits included in a largest segment of the data packet. By ensuring that a weight of at least one possible encoded data packet will satisfy a target weight range when the possible encoded data packets are generated in a sequential and cumulative fashion, latencies and overhead associated with obtaining encoded data packets may be decreased.

In some cases, the target weight range may be offset (e.g., from a specific weight, such as $$\frac{N}{2})$$

while still guaranteeing mat a weight associated with at least one of the hypotheses will fall within the target weight range. The offset target weight range may be represented as $$\left[\frac{N}{2} - m, \frac{N}{2}\left(1 + \frac{2}{r_2} - \frac{2}{N} - \frac{2m}{N}\right)\right],$$

where m>0 so long as the offset target weight range includes $$\frac{N}{2}.$$

Alternatively, me onset target weight range may be represented as $$\left[\frac{1}{2} - \frac{m}{N}, \frac{1}{2}\left(1 + \frac{2}{r_2} - \frac{2}{N} - \frac{2m}{N}\right)\right]$$

after normalization, where m>0 so long as the offset target weight range includes ½. In some case, to achieve a specific target weight when the third option is used, an additional segment of bits may be appended to the data packet—e.g., to achieve a specific target weight using a possible encoded data packet that satisfies the target weight range.

In some examples, for the third option, $r_2$ hypotheses may be tested, rather than $r_2+1$ hypotheses, and thus, $\lceil \log_2(r_2) \rceil$ encoding bits may be used to indicate which segments of the data packet were inverted during the encoding process. For example, $r_2$ hypotheses may be tested when a weight range for a data packet is symmetric across $$\frac{N}{2}$$

(e.g., $$\left[\frac{N}{2} - \frac{l}{2}, \frac{N}{2} + \frac{l}{2}\right].$$

In such case, inverting all of the segments or none of the segments may yield the same quality of result (e.g., the same distance from $$\frac{N}{2}\bigg),$$

and one or the cases may not need to be tested. In such cases, a smaller number of encoding bits may be used to indicate which segments are inverted—e.g., when $\lceil \log_2(r_2) \rceil < \lceil \log_2(r_2+1) \rceil$.

When the memory device 110 receives a read command (from the host device 105) requesting data that has been encoded prior to storage in a memory array 170, the memory device 110 may use the encoding bits that are stored with the encoded data packet to reconstruct the originally received data packet. The process of reconstructing the original data packet from the encoded data packet may be referred to as decoding. After the encoded data packet is decoded, the memory device 110 may output the originally received data packet to the host device 105. Alternatively, the memory device 110 may output the encoded data packet and the associated encoding bits so that an external device (e.g., the host device 105) may decode the encoded data packet.

Encoding and decoding as described herein may be performed (and thus related encoding and decoding circuitry may be located) at different places within a system 100, depending on implementation. For example, encoding and decoding may be performed within a memory die 160 (e.g., at a local memory controller 165) or otherwise within a memory device 110 (e.g., at a device memory controller 155), or within a host device 105 (e.g., at an external memory controller 120). In some cases, where encoding and decoding are performed may be based on a position of error correction circuitry within system 100. For example, when a data packet is to be encoded and written to a memory array 170, encoding for balancing purposes may be performed prior to related (e.g., write-side) error correction procedures, and when an encoded data packet is to be read and decoded, related (e.g., read-side) error correction procedures may be performed prior to decoding.

Encoding and decoding for balancing purposes may be considered a higher level function relative to error correction, and thus encoding and decoding may be performed with in a same device or at a higher level device relative to the error correction. For example, if the error correction circuitry is located within a host device 105 (e.g., at external memory controller 120), then encoding/decoding circuitry may be located within the host device 105 (e.g., at external memory controller 120). If error correction circuitry is located within a memory device 110 (e.g., at a device memory controller 155), then encoding/decoding circuitry may be located within the memory device 110 (e.g., at a device memory controller 155) or within the host device 105 (e.g., at external memory controller 120). And if the error correction circuitry is located on a memory die 160 (e.g., at a local memory controller 165), then encoding/decoding circuitry for performing the balancing procedure may be located within any of the memory die 160 (e.g., at a local memory controller 165), the memory device 110 (e.g., at a device memory controller 155), or the host device 105 (e.g., at external memory controller 120).

Figure 2:
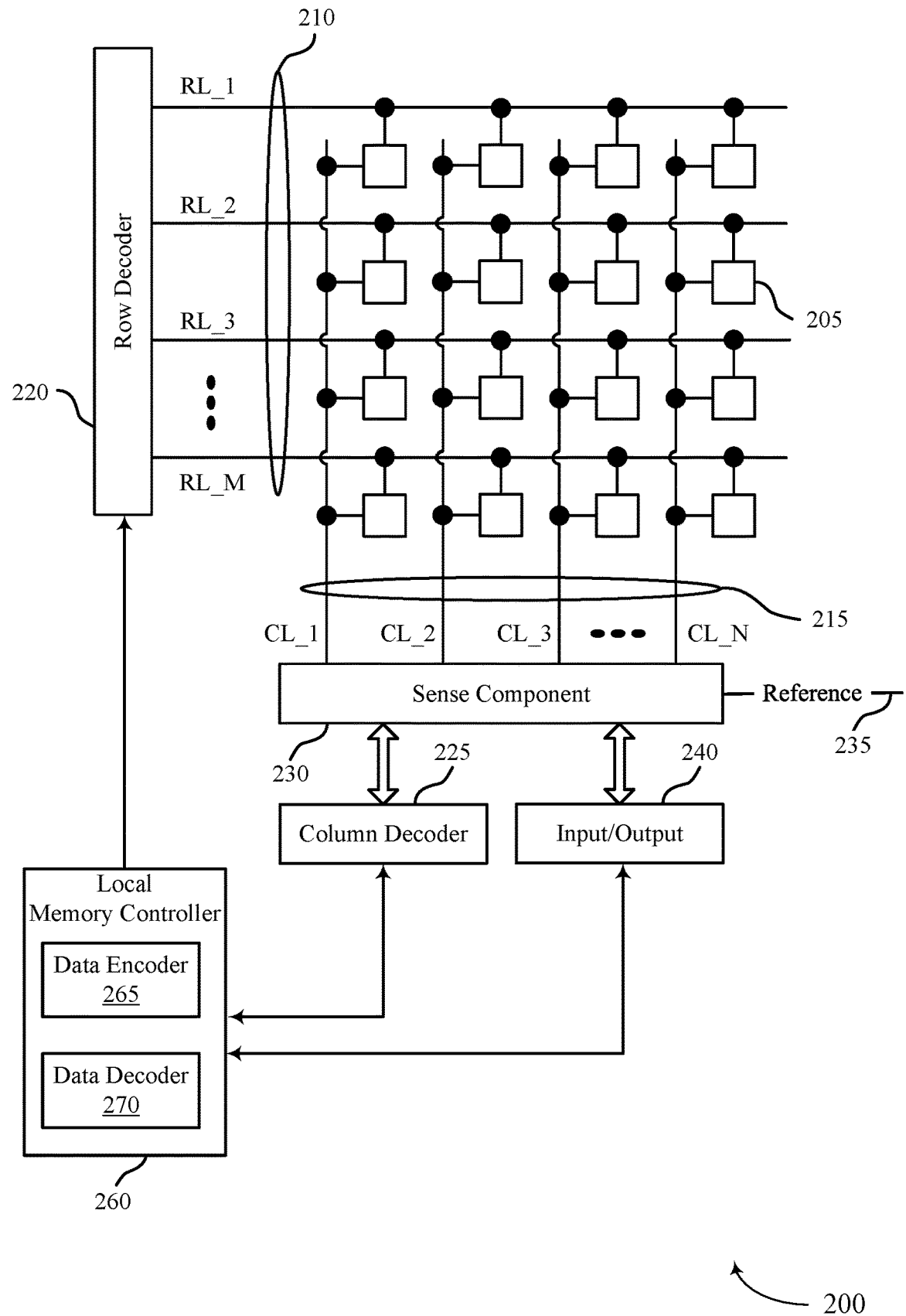
FIG. 2 illustrates an example of a memory die that supports balancing data for storage in a memory device in accordance with examples as disclosed herein.

FIG. 2 illustrates an example of a memory die 200 that supports balancing data for storage in a memory device in accordance with examples as disclosed herein. It should be noted the following is just one example of how balancing data for storage in a memory device may be implemented. The techniques disclosed herein may be implemented with any memory device. For example, the techniques disclosed herein may be implemented with FeRAM, PCM, and the like. In this example, the memory die 200 may be an example of the memory dies 160 described with reference to FIG. 1.

In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some cases, memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 260 and activate a row line 210 based on the received row address. A column decoder 225 may receive a column address from the local memory controller 260 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference signal 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 260 may control the accessing of memory cells 205 through the various components (e.g., row decoder 220, column decoder 225, sense component 230). The local memory controller 260 may be an example of the local memory controller 165 described with reference to FIG. 1. In some examples, one or more of the row decoder 220, column decoder 225, and sense component 230 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target row line 210 and the target column line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The local memory controller 260 may apply a specific signal (e.g., write pulse) to the column line 215 during the write operation to store a specific state in the storage element of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 260 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration.

Before performing a write operation, or as part of performing a write operation, for storing a received data packet, the local memory controller 260 may be operable to encode a received data packet and to write the encoded data packet rather than the received data packet to a memory array. The local memory controller 260 may include a data encoder 265 that is operable to perform an encoding operation before or as part of a write operation. The data encoder 265 may divide a data packet into r segments and determine which segments of a data packet to invert to obtain an encoded data packet having a weight that is within a target range. The data encoder 265 may be configured to determine weights for r+1 encoded data packets that can possibly be derived from the data packet (including an encoded data packet that is the same as the original data packet) and to identify a possible encoded data packet having a weight that falls within a target weight range. The target weight range may be stored in the data encoder 265 and may span the values $$\left[\frac{N}{2}, \frac{N}{2}\left(1+\frac{2}{r}-\frac{2}{N}\right)\right],$$

where N may be the quantity of bits included in the data packet. The target weight range may be configured to ensure that at least one of the possible encoded data packets will have a weight that falls within the target weight range.

The data encoder 265 may also configure an encoding segment that indicates which of the segments of the encoded data packet are inverted. The data encoder 265 may also configure a padding segment that is used to increase a weight of a constant weight encoded data packet so that the final weight of the constant weight encoded data packet is equal to a specific target weight and/or balanced. The encoded data packet that is stored in a memory array may include the encoding segment and the padding segment.

After performing a read operation, or as part of performing a read operation, for providing a requested data packet to a host device, the local memory controller 260 may be operable to decode an encoded version of the requested data packet. The local memory controller 260 may include a data decoder 270 that is operable to perform a decoding operation after or as part of a read operation. The data decoder 270 may be configured to determine which segments of an encoded data packet were inverted during the encoding process—e.g., using the encoding bits stored in the encoded data packet. After the encoded data packet is decoded, the original data packet may be reconstructed and transmitted to the host device.

In some cases, data encoder 265 and data decoder 270 are located external to local memory controller 260—e.g., based on a location of error correction circuitry. For example, data encoder 265 and data decoder 270 may be located external to local memory controller 260 if error correction circuitry is located external to local memory controller 260—e.g., if the error correction circuity is located at a device memory controller or a host device. As discussed herein, a location of data encoder 265 and data decoder 270 may be selected so that an error correction procedure is performed after an encoding procedure and before a related decoding procedure.

Figure 3:
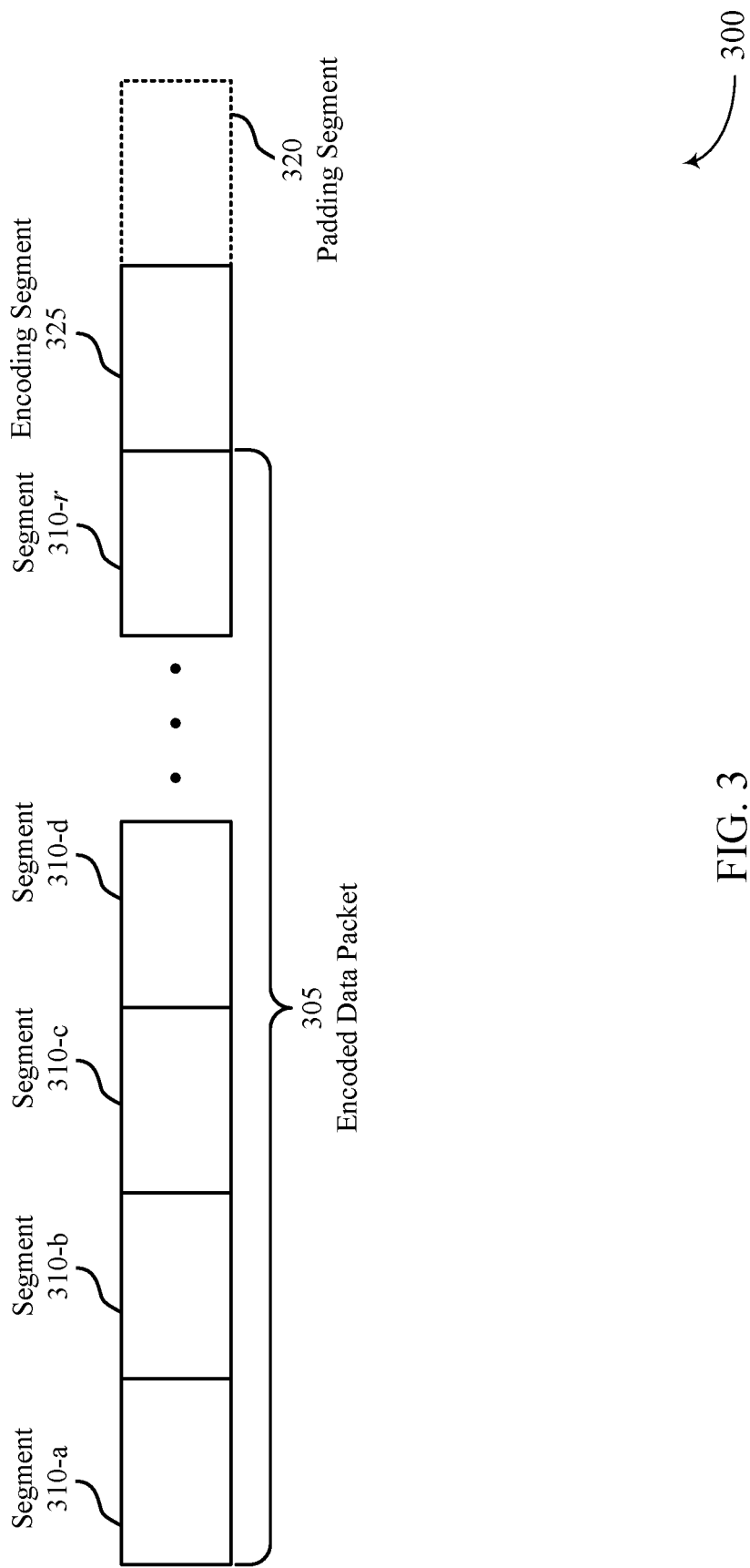
FIG. 3 illustrates an example of a data structure that supports balancing data for storage in a memory device in accordance with examples as disclosed herein.

FIG. 3 illustrates an example data structure 300 that supports balancing data for storage in a memory device in accordance with examples as disclosed herein. Data structure 300 may include encoded data packet 305 and encoding segment 325.

Encoded data packet 305 may include N encoded data bits that are stored in a memory array (e.g., a memory array 170 of FIG. 1). Encoded data packet 305 may be an encoded version of a data packet received from a host device in connection with a single read command (e.g., as a single data burst). Thus, data packet 310 may include N altered (e.g., encoded) data bits relative to N bits of a received data packet.

A weight may be assigned to encoded data packet 305 based on a quantity of bits included in encoded data packet 305 that have a given logic value (e.g., logic value 1). For example, if encoded data packet 305 includes one hundred (100) bits having a logic value of 1, then encoded data packet 305 may have a weight of one hundred (100). In some cases, the weight of encoded data packet 305 may be expressed in terms of the ratio between the quantity of bits included in encoded data packet 305 having the given logic value and the total quantity of bits included in encoded data packet 305—e.g., encoded data packet 305 may have a weight of 25% when there is a total of two-hundred sixty four (264) bits in encoded data packet 305 and sixty-four (64) of those bits have a logic value of 1. Encoded data packet 305 may be considered a balanced data packet if encoded data packet includes a same quantity of bits having a first logic value as bits having a second logic value. Encoded data packet 305 may be considered a constant weight data packet if the weight of encoded data packet 305 is equal to a target weight (e.g., $$\frac{N}{2} \text{ or } \frac{1}{2}\right).$$

Encoded data packet 305 may be a balanced or a constant weight encoded data packet, or may have a weight that is within a target weight range (e.g., $$\left[\frac{N}{2}, \frac{N}{2}\left(1+\frac{2}{r_2}-\frac{2}{N}\right)\right]\right).$$

Encoded data packet 305 may be (virtually or physically) divided into multiple segments 310. In some cases, encoded data packet 305 is divided into r segments 310. In some cases, each segment 310 may include n bits. In other cases, each segment 310 may include a varying number of bits. A weight may be assigned to a segment 310 based on a quantity of bits included in a segment 310 that have a given logic value (e.g., logic value 1). In some cases, each segment 310 may be associated with a unique index. In some examples, the indices may be assigned to the segments 310 in an order of appearance. For instance, segment 310-a may be associated with the index 1, segment 310-b may be associated with the index 2, and so on until segment 310-r may be associated with the index r—e.g., which may be represented as {1, 2, 3, 4, 5, 6, 7, 8} when r=8. In other examples, the indices may be assigned to segments 310 out of an order of appearance. For instance segment 310-a may be associated with the index 3, segment 310-b may be associated with the index 1, and so on until segment 310-r may be associated with the index 4—e.g., which may be represented as {3, 1, 2, 7, 5, 6, 8, 4} when r=8. In both cases, no index may be repeated more than once.

The segments 310 of encoded data packet 305 may correspond to the segments of a received data packet. To obtain encoded data packet 305, weights of a set of possible encoded data packets (that includes encoded data packet 305) may be computed in accordance with a sequential and cumulative inversion of the corresponding segments of the received data packet. The sequential and cumulative inversion of the corresponding segments may involve calculating a weight for an unaltered version of the data packet, a weight for a version of the data packet if the first segment associated with a first index is inverted, a weight for a version of the data packet if the first segment and a second segment associated with a second index is inverted, and so on until a weight that satisfies a target weight range is obtained.

Encoding segment 325 may include a quantity of encoding bits that collectively indicate which segments 310 of encoded data packet 305 are inverted as a result of an encoding operation performed for a data packet. The quantity of encoding bits included in encoding segment 325 may be based on a number of combinations of inverted and noninverted bits that may possibly be derived from a received data packet in accordance with an encoding scheme used to balance a received data packet. For example, if $2^N$ combinations are possible, then encoding segment 325 may include $\log_2 (2^N)=N$ bits.

In some examples, a memory device receives a data packet from a host device. Prior to storing the data packet in a memory array, the memory device may encode the data to obtain encoded data packet 305, where encoded data packet 305 may be a balanced or other type of constant weight data packet, or may have a weight within a target weight range. To obtain encoded data packet 305, a weight of possible encoded versions of the data packet may be tested in accordance with a non-repeating (e.g., sequential) and cumulative inversion of segments of the data packet until encoded data packet 305 is identified, where encoded data packet 305 may have a weight equal to a target weight or within a target weight range. That is, the memory device may determine a first weight for a first encoded version of a data packet assuming a segment corresponding to segment 310-a is inverted and check if the first weight is within a target weight range. If so, the memory device may invert the segment yielding encoded data packet 305 with first segment 310-a being inverted and configure encoding segment 325 to indicate that segment 310-a has been inverted. The memory device may then store encoded data packet 305 and encoding segment 325 in a memory array. Otherwise, the memory device may determine a second weight for a second encoded version of the data packet assuming segments corresponding to segment 310-a and segment 310-b are inverted and check if the second weight is within the target weight range. If so, the memory device may invert the segments yielding encoded data packet 305 with first segment 310-a and second segment 310-b being inverted. Otherwise, the memory device may continue testing weights for possible encoded versions of the encoded data packet 305 until a weight is determined that is within the target weight range.

In some examples, bounds (e.g., a lower bound, an upper bound, a span, or any combination thereof) of the target weight range may be selected to guarantee that the sequential and cumulative inversion of segments of a data packet will yield an encoded version of a data packet having a weight that is within the target weight range (e.g., target weight range may be equivalent to the range $$\left[\frac{N}{2}, \frac{N}{2}\left(1+\frac{2}{r_2}-\frac{2}{N}\right)\right]\right).$$

In some cases, the span of the target weight range may be greater than a number of bits included in a largest segment 310 of encoded data packet 305. For example, if each segment 310 includes the same quantity of bits (n), the span of the target weight range may be greater than or equal to n. By balancing encoded data packet 305, the memory device may support advanced read techniques with lower latency, lower power consumption, better reliability, or other benefits.

In some cases, data structure 300 may also include a padding segment 320, which may support obtaining a specific target weight for a set of bits configured in accordance with data structure 300. The padding segment 320 may include some quantity of padding (dummy, filler) bits. Once the weight of encoded data packet 305 satisfies a target weight range (e.g., between 49% and 51% or between a weight of 128 and 135), the padding segment 320 may be used to adjust (fine-tune) the combined weight of the encoded data packet 305 and the padding segment 320 to equal a specific target weight (e.g., 50% or an exact weight of 128). The specific target weight may be 50%, a power of two (2), or any other weight that supports advanced read techniques or provides other benefits. The padding segment 320 may include any quantity of bits, depending on implementation. In some cases, the padding segment 320 may include a quantity of bits equal to one less than a span of the target weight range (e.g., the padding segment 320 may include seven (7) bits when the target range is 128-135, where the span of 128 through 135 is eight (inclusive)), though one of ordinary skill in the art will appreciate that other quantities of bits for the padding segment 320 are also possible. In some cases, the span of the target range may be equal to n, and thus the padding segment 320 may include n−1 bits.

As an illustrative example, encoded data packet 305 may include a total of 256 bits and have a target weight range between 121 to 128. Also, the padding segment 310 may include seven (7) bits. After the weight of encoded data packet 305 is determined to be within target weight range, using the segment-by-segment encoding scheme described herein, one or more of the bits in padding segment 320 may be inverted to achieve a specific target weight of 128 (e.g., which is half of 256 and a power of two (2)) for a combination of encoded data packet 305 and encoding segment 325. For example, if encoded data packet 305 has a weight of 122, then padding segment 320 may be configured so that six of the seven bits included in padding segment 320 have the first logic value (e.g., are ones). This way, the combined weight of encoded data packet 305 and padding segment 320 may be equivalent to 128. It is to be understood that this and any other specific numeric examples herein are provided solely for the sake of illustrative clarity and are not limiting of the claims.

In some examples, the memory device may, for purposes of encoding and decoding operations as described herein, include the quantity of bits in the padding segment 320 in the total quantity of bits N'. For example, the encoded data packet 305 may include a total of 256 bits and the padding segment 320 may include seven (7) bits to yield a total quantity N' of 263 bits. The encoded data packet 305 target weight range may be between 124 and 131, such that after the target weight range is achieved, the bits from the padding segment 320 may be inverted to achieve a specific target weight of 131 for the combined weight of encoded data packet 305 and padding segment 320. In some cases, the encoding bits in encoding segment 325 and the padding bits in padding segment 320 may be included in the total quantity of bits N". In such cases, the padding bits may similarly be used to achieve a target weight for the combined weight of encoded data packet 305, encoding segment 325, and padding segment 320—that is, taking into consideration a number of bits in the encoding segment 325 having the first logic value.

Figure 4:
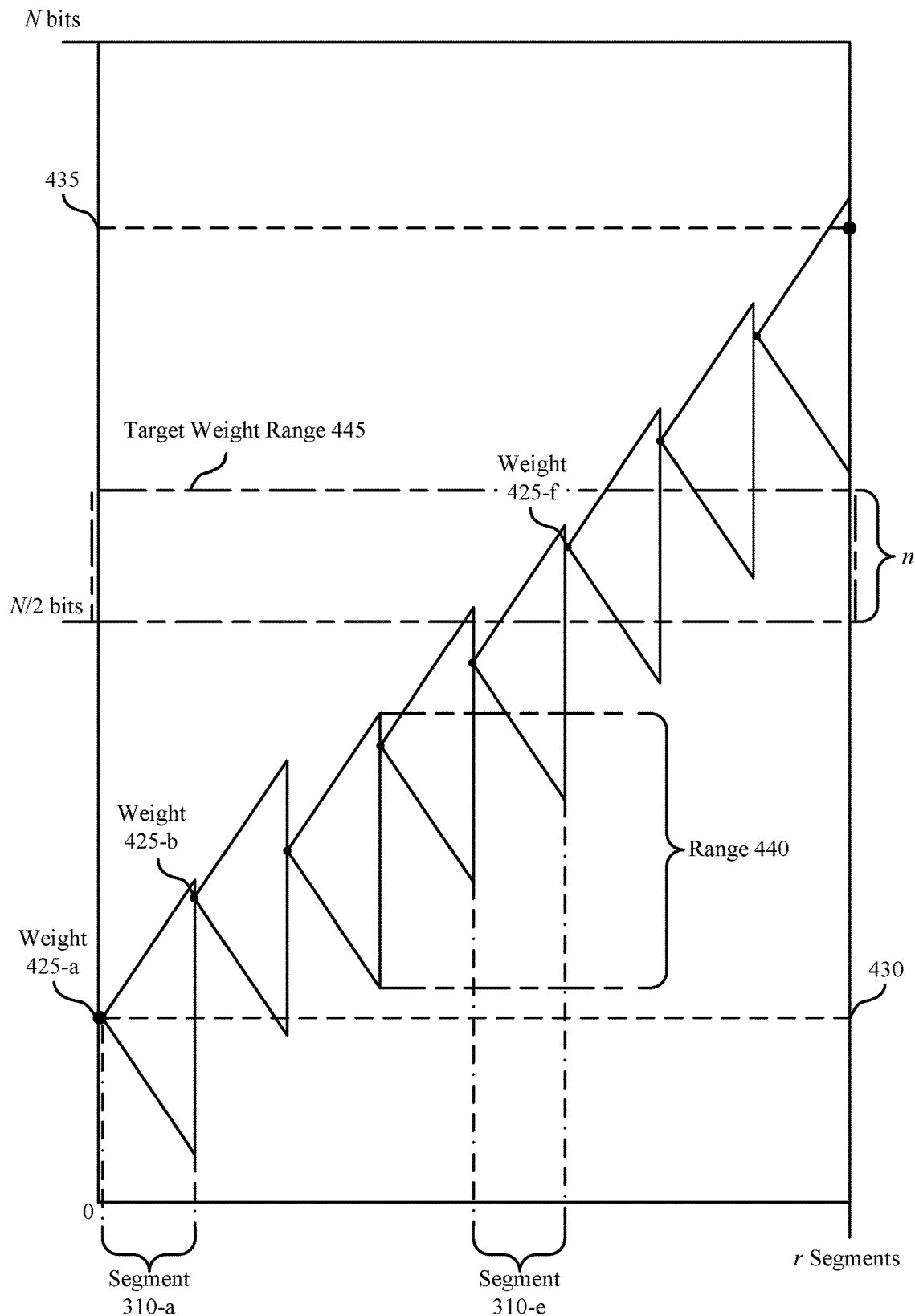
FIG. 4 illustrates an example of an inversion diagram that supports balancing data for storage in a memory device in accordance with examples as disclosed herein.

FIG. 4 illustrates an inversion diagram 400 that supports balancing data for storage in a memory device in accordance with examples as disclosed herein. Inversion diagram 400 may be an example of an encoding operation (e.g., series of segment-by-segment inversions) performed on a data packet that yields encoded data packet 305, where a weight of encoded data packet is within a target weight range. Inversion diagram 400 may illustrate the weight of different encoded versions of a data packet, with N shown on the vertical access and r shown on the horizontal axis. Inversion diagram 400 may illustrate the inversion of segments 310, and a target weight range 445. Additionally, inversion diagram 400 may illustrate changes in the weight of the page as the memory device inverts a first segment 310-a, a second segment 310-b, a third segment 310-c, and so on.

As described herein, a memory device may perform an encoding operation to obtain an encoded data packet (e.g., encoded data packet 305) having a weight that is equal to target weight (e.g., $$\frac{N}{2})$$

and/or within target weight range 445. In accordance with the examples described herein, the memory device may divide a data packet having N bits into r segments, where each segment may contain n bits, or the segments may contain a varying quantities of bits. For example, a data packet may include a total of 256 bits (e.g., N), divided into eight (8) segments 310 (e.g., r=8), where each segment 310 includes 32 bits (e.g., n=32). In other examples, the r segments may have a different quantity of bits—e.g., the first segment 310-a may have 30 bits, the second segment may have 36 bits, and so on.

The memory device may assign each segment 310 a unique index. In some examples, weights for an encoded version of a data packet may be determined in accordance with a one-by-one inversion of the segments based on their respective indices. For example, if the data packet is partitioned into eight segments 310, the page may be inverted in accordance with a sequential, non-repeating index pattern of {1, 2, 3, 4, 5, 6, 7, 8}. Alternatively, an out-of-order, non-repeating index pattern of {1, 5, 3, 2, 4, 6, 8, 7} may be used, so long as no segment 310 is inverted more than once.

Additionally, inversion diagram 400 may illustrate the weight (W) of different encoded versions of a data packet before and after each segment 310 is inverted. For example, weight 425-a may represent the weight of the data packet before the first segment 310-a is inverted. Weight 425-b may represent the weight of the data packet after the first segment 310-a is inverted but before the second segment 310-b is inverted, and so on. Because each (or a largest) segment 310 may include n bits, the inversion of an individual segment 310 may change the weight of the encoded data packet 305 by an amount within range 440, where a span of the range 440 may be equal to 2n. That is, at most the weight of the page may increase by the amount n or decrease by the amount n after an inversion of a segment 310. For example, if segment 310-a includes eight (8) bits, the weight 425-a of the data packet may increase at most by eight (8) (e.g., if all of the bits in segment 310-a were at a logic state 0 before the inversion) or decrease at most by eight (8) (e.g., if all of the bits of 310-a were at a logic state 1 before the inversion). Therefore, the span of the range 440 may be sixteen (e.g., equal to 2n). In some examples, when a weight of the data packet is lower than $$\frac{N}{2},$$

a likelihood that the weight of the data packet will increase when a segment is inverted may be greater. Alternatively, when a weight of the data packet is higher than $$\frac{N}{2},$$

a likelihood that the weight of the data packet will decrease when a segment is inverted may be greater.

After dividing a data packet into r segments 310, but before performing any inversions, the memory device may calculate the initial weight 425-a of the page and determine whether the initial weight 425-a is within the target weight range 445. If the initial weight 425-a is within the target weight range 445, the memory device may refrain from computing weights for any inversion combinations. In the example illustrated in FIG. 4, the initial weight 425-a may be outside the target weight range 445 and the memory device may therefore compute a weight for the data packet assuming segment 310-a is inverted, where inverting segment 310-a may change the weight of the data packet from weight 425-a to weight 425-b. Although FIG. 4 illustrates weight 425-b as near the top of the range associated with first segment 310-a, weight 425-b may be anywhere within the range 440 relative to the initial weight 425-a.

After inverting the first segment 310-a, the memory device may calculate the weight 425-b of the modified data packet and determine if the weight 425-b is within the target weight range 445. In general, the memory device may determine the weight of the different versions of the data packet after each assumed inversion of a subsequent segment 310 and determine if the target weight range 445 has been achieved. Once the weight of the encoded data packet 305 is within the target weight range 445, the memory device may refrain from determining any additional weights for a remaining set of inversion combinations for the data packet. So long as the weight remains outside the target weight range 445, the memory device may continue to compute additional weights for versions of the data packet having an additional inverted segment 310 until the target weight range 445 is achieved, where the additional segments 310 may be determined in a sequential order. In this example, weight 425-b is outside of the target weight range 445, and the memory device, thus, may continue computing additional weights based on an inversion of additional segments 310 in accordance with the sequential order until weight 425-f is achieved, which is within the target weight range 445. In the example of FIG. 4, weight 425-f is achieved after inverting a fifth segment 310-e of a data packet.

After identifying a version of the data packet that has a weight within the target weight range 445, the memory device may generate an encoded data packet that corresponds to the identified version of the data packet. In some cases, the memory device stores a unique index associated with the last inverted segment associated with the identified version of the data packet. For example, if the version of the data packet is identified after inverting a segment having an index of five (5), the memory device may set a set of bits in an encoding segment equal to five (5). When memory device later decodes the encoded data packet, memory device may determine that segments having indices that are less than or equal to five (5) were inverted during the encoding process.

As described herein, the target weight range 445 may be selected such that performing the sequential non-repeating inversions may guarantee a weight within the target weight range 445 is at some point achieved. For example, if the segments 310 each include the same quantity n of bits, the target weight range 445 may have a span that is the same as or greater than n. As another example, if at least some of the segments 310 contain different quantities of bits, the target weight range 445 may have a span that is the same as or greater than the quantity of bits in the largest segment 310. Because the weight of the encoded data packet 305 may increase or decrease by no more than n following an inversion of a segment 310, selecting the target weight range 445 to be the same as or greater than n may guarantee that the sequential inversion operation will eventually achieve the target weight range 445, as no single inversion operation may bypass the range entirely. In some cases, the target weight range 445 may be based on the following formula:

$$R = \left[\frac{N}{2}, \frac{N}{2}\left(1 + \frac{2n}{N} - \frac{2}{N}\right)\right].$$

Selecting the target weight range 445 to be the same as or larger than n may guarantee that the sequential non-repeating inversion achieves the target weight range 445 after some k quantity of inversions. For example, let $w_i = W(X_i)$ be the weight of segment i. When the memory device uses a non-repeating and cumulative encoding scheme, there may be r+1 possible inversion patterns, including an inversion pattern that includes zero inverted segments. Let $Y_0$ to $Y_r$ represent the r+1 possible inversions. That is, $Y_0=(x_1, x_2, \ldots, x_r)$, $Y_1=(\bar{x}_1, x_2, \ldots, x_r)$, $Y_2=(\bar{x}_1, \bar{x}_2, \ldots, x_r) \ldots Y_r=(\bar{x}_1, \bar{x}_2, \ldots, \bar{x}_r)$, where $x_k$ represents a non-inverted segment, $\bar{x}_k$ represents an inverted segment, and r represents the total quantity of segments included in a data packet. In this example, $Y_r$ may represent the case where each segment included in a data packet is inverted. Let $S_i=W(Y_i)$ be the weight of the pattern $Y_i$. In this case, $S_0=W(Y_0)$ or the initial weight 430. This may result in a set of possible weights: $S_k=S_{k-1}+n-2w_k$, where n represents the quantity of bits in each segment x, k represents the $k^{th}$ quantity of inversions, and $2w_i$ accounts for the change in weight after the $k^{th}$ segment 310 is inverted. Thus, $S_1=S_0+n-2w_1$ and $S_r=S_{r-1}+n-2w_r$.

Because the weight of $S_i$ moves at a quantity no greater than n, when the target weight range 445 is n or larger, a non-repeating (e.g., sequential), and cumulative inversion of segments may guarantee that the target weight range 445 is met. That is $-n \leq S_k - S_{k-1} \leq n$. Additionally, the memory device may reduce latencies associated with generating an encoded data packet by calculating the possible weights of a data packet using the weights of the individual segments $w_i$. That is, after determining an initial weight of the data packet and the weights of the individual segments 310, the memory device may compute all of the possible weights for a data packet (assuming all of the different inversion patterns) using the equation $S_k=S_{k-1}+n-2w_k$, where $0 \leq k \leq r$. The memory device may then determine which of the weights is within the target weight range—e.g., a weight of an encoded version of the data packet having the smallest number of inverted segments—and may generate the corresponding encoded data packet.

In some cases, a memory device may select a target weight range 445 that includes a weight of 50% or N/2 (e.g., to support one or more advanced read techniques). Further, if the initial weight 425-a of a page 305 is low (as illustrated in the example of FIG. 4), sequentially inverting segments 310 will tend to increase the weight of the page 305, whereas if the initial weight 425-a is instead high (e.g., near or equal to N), sequentially inverting segments 310 will tend to decrease the weight of the page. Thus, encoding a page 305 as described herein will tend towards N/2 and eventually enter a range than includes N/2 regardless of the initial weight 425-a of the page 305. Additionally, in some examples if the initial weight 430 has a value of W then the ending weight 435—e.g., the weight of the page if each segment 310 was inverted—may be equal to N−W. Thus, the generalized Knuth algorithm may be a symmetrical operation and may begin from either weight 430 or weight 435.

As discussed herein, a padding segment may also be stored with an encoded data packet to achieve a specific target weight (e.g., $$\frac{N}{2}).$$

In such cases, after identifying a version of a data packet that has a weight within target weight range 445, the memory device may set the bits included in the padding segment to a value that includes a quantity of bits having a first logic value to achieve a weight for the combined encoded data packet and padding segment that is equivalent to the specific target weight.

Figure 5:
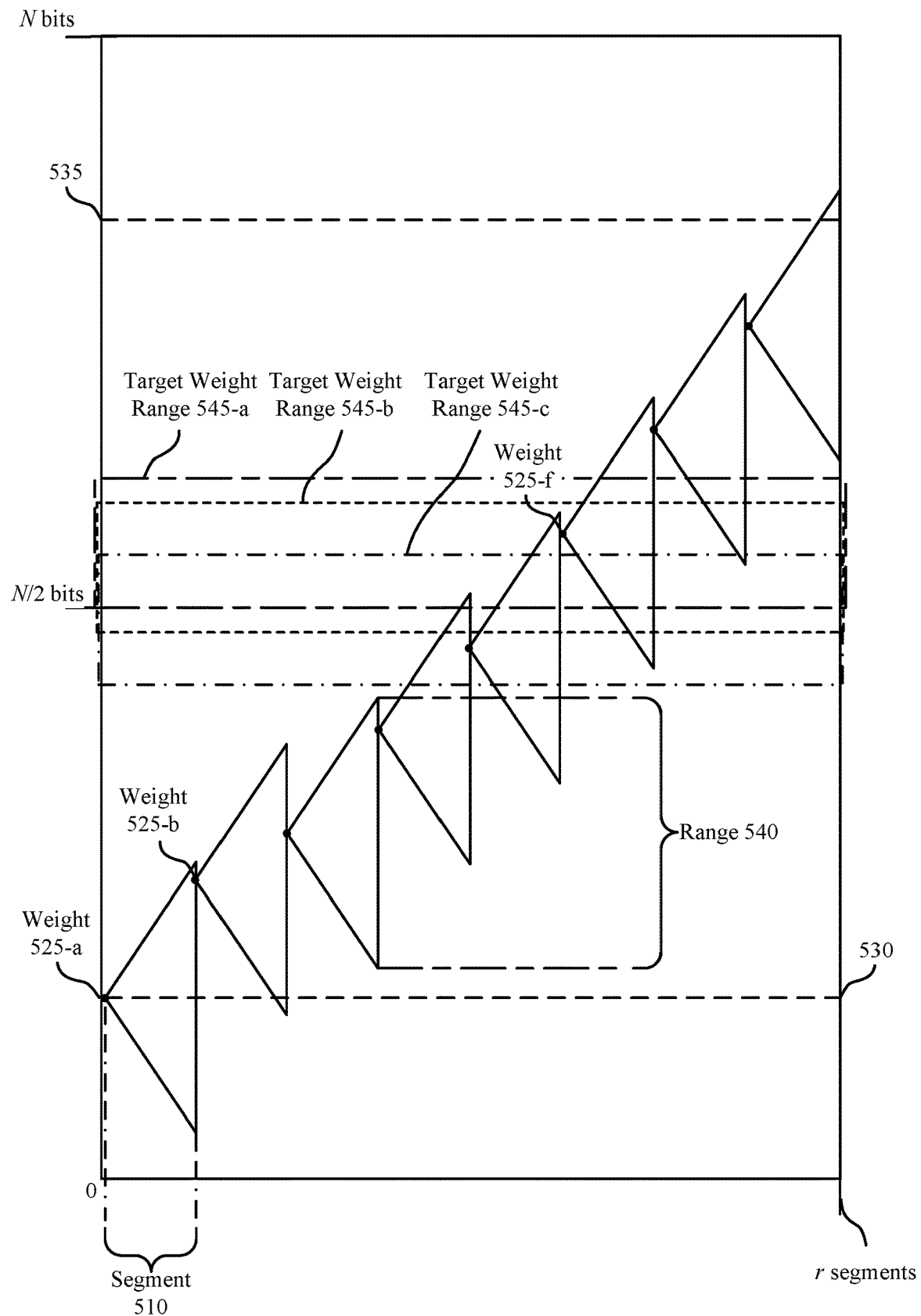
FIG. 5 illustrates an example of an inversion diagram that supports balancing data for storage in a memory device in accordance with examples as disclosed herein.

FIG. 5 illustrates an inversion diagram 500 that supports balancing data for storage in a memory device in accordance with examples as disclosed herein. Inversion diagram 500 may be an example of an encoding operation performed on a data packet or page to achieve a target weight or target weight range.

Segment 510 may be an example of segment 310; weights 525, 530, and 535 may be examples of weights 425, 430, and 435; range 540 may be an example of range 440; and target weight range 545-a may be an example of target weight range 445 (e.g., a target weight range as described with reference to FIG. 3).

As described herein, a memory device may perform an encoding operation to obtain an encoded data packet having a target weight or a target weight range (e.g., target weight range 545) before storing the data received in the data packet. The memory device may perform the encoding operation by dividing the page into r segments having n bits and determining weights for different inversion patterns that are derived in accordance with a non-repeating and cumulative sequence.

In some examples, an initial target weight range 545-a may be shifted relative to the example illustrated in FIG. 4. For example, the initial target weight range 545-a may be shifted up or down while still including $$\frac{N}{2}$$

at or within the bounds of the target weight range 545-a. In some cases, the initial target weight range 545-a may be shifted based on the following formula:

$$R_m = \left[\frac{N}{2}\left(1 - \frac{2m}{N}\right), \frac{N}{2}\left(1 + \frac{2n}{N} - \frac{2}{N} - \frac{2m}{N}\right)\right],$$

which may be alternatively expressed as $$R_m = \left[\frac{N}{2} - m, \frac{N}{2} + n - 1 - m\right].$$

The variable $R_m$ may be associated with a modified target weight range 545 and the variable m may be any quantity between 0 and n−1—to ensure that the modified range includes $$\frac{N}{2}.$$

That is, when m is equal to n−1, the upper bound of the modified target weight range may include $$\frac{N}{2}$$

as an upper bound. In some examples, when m=2, the modified target weight range 545-*b* may be between $$\frac{N}{2} - 2$$

and $$\frac{N}{2} + n - 3.$$

Thus, when m=2, N=256, and n=8, the target weight range 545-*b* may be between the weights 126 to 133. A target weight range 545-*c* may similarly be determined choosing a different value for m.

In some cases, a memory device may be configurable (e.g., based on a fuse setting or a mode register setting) to use any of a set of supported target weight ranges 545. In some examples, a value for m may be stored in a register in memory device, and the memory device may offset the initial target weight range 545-*a* in accordance with the stored value. In other cases, the memory device may be configured to select different values for m—e.g., based on a configured operating mode, an operating age of the memory device, etc.

Figure 6:
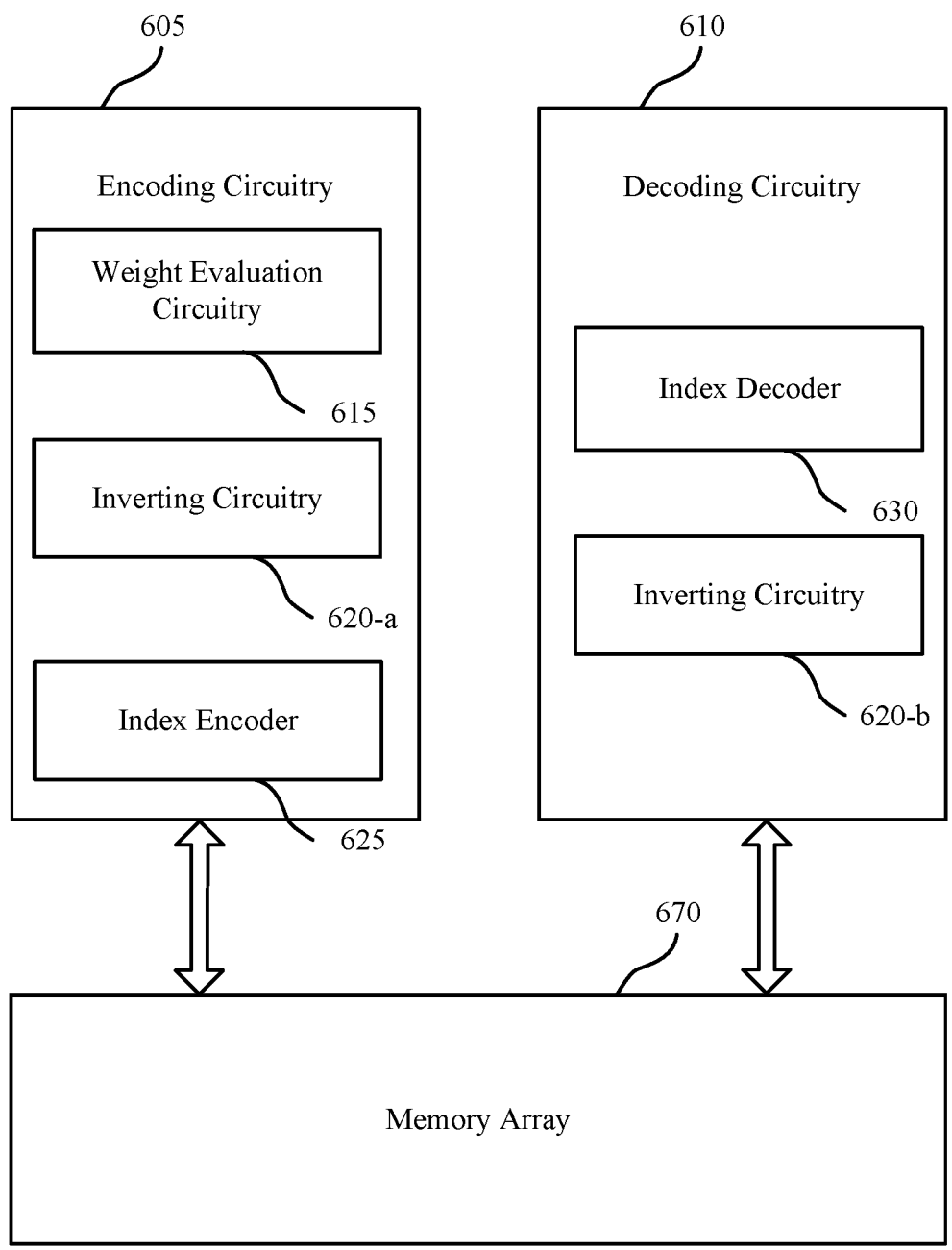
FIG. 6 illustrates an example of a memory device that supports balancing data for storage in a memory device in accordance with examples as disclosed herein.

FIG. 6 illustrates a memory device 600 that supports balancing data for storage in a memory device in accordance with examples as disclosed herein. Memory device 600 may perform aspects of an encoding operation to achieve a target weight or target weight range as described herein. Memory device 600 may also perform aspects of a decoding operation as described herein. Memory device 600 may include an encoding circuitry 605, which may be an example of a data encoder 265 as described with reference to FIG. 2, and which may include weight evaluation circuitry 615, inverting circuitry 620-*a*, and index encoder 625. Memory device 600 may also include a decoding circuitry 610, which may be an example of a data decoder 270 as described with reference to FIG. 2, and which may include index decoder 630 and inverting circuitry 620-*b*. In some examples, the encoding circuitry 605 and the decoding circuitry 610 may share inverting circuitry 620. Additionally, memory device 600 may include a memory array 670, which may be an example of memory array 170 as described with reference to FIG. 1.

A location of encoding circuitry 605 and decoding circuitry 610 may be based on a location of error correction circuitry used for memory array 670. For example, encoding circuitry 605 and decoding circuitry 610 may be located on a same die as memory array 670—e.g., if the error correction circuitry is located on the same die as memory array 670. Or encoding circuitry 605 and decoding circuitry 610 may be outside of a die that includes memory array 670—e.g., if the error correction circuitry not located on the same die as the memory array 670. For example, a location of encoding circuitry 605 and decoding circuitry 610 may be selected so that encoding by encoding circuitry 605 is performed before write-side error correction and so that decoding by decoding circuitry 610 is performed after read-side error correction.

In some examples, the encoding circuitry 605 may receive, from a host device (e.g., a host device 105) data to store at the memory array 670. In some examples, the data may be included in a data packet that is divided into r segments. In other examples, the encoding circuitry 605 may divide the page into r segments. As described herein, each bit in the data packet may have a given logic state (e.g., a logic state 1 or 0). The weight evaluation circuitry 615 may determine a weight of the data packet—either as received or after a segment of the data packet has been inverted—and calculate whether the weight is within a target weight range or equivalent to a target weight as described herein.

In some examples, the weight evaluation circuitry 615 may first calculate the weights of all of the inversion possibilities. For example, the page may be divided into eight (8) segments and the weight evaluation circuitry 615 may calculate the initial weight of the page, the weight of the page after inverting the first segment, the weight of the page after inverting the first and second segment, and so on until calculating the weight of inverting all eight (8) segments. The weight evaluation circuitry 615 may then determine which possible inversion combination is the first one to achieve the target weight range (e.g., inverting segments 1 through 5). The weight evaluation circuitry 615 may then send a command to the inverting circuitry 620-*a* indicating which segments to invert.

In some cases, after identifying that a version of a data packet that is associated with an inversion pattern satisfies a target weight range, the weight evaluation circuitry 615 may use a padding segment to cause a combined weight of the identified version of the data packet and the padding segment to equal a specific target weight—e.g., by setting one or more bits in the padding segment 320 to a given logic value. For example, the weight evaluation circuitry 615 may determine a difference between the weight of the identified version of the data packet and a specific target weight is equal to the value two (2). The weight evaluation circuitry 615 may then configure the padding segment so that two (2) bits in the padding segment 320 have a given logic value (e.g., 1)—the remaining bits in the padding segment 320 may have the other logic value (e.g., 0).

The index encoder 625 may generate an encoding segment 325 that includes an indication (value) of an index associated with the last segment to be inverted by the inverting circuitry 620-*a* (if any), and which led to the weight of the page being within the target weight range, as described herein. Where applicable, the indication generated by the index decoder 630 may indicate that no segment was inverted.

After the encoding circuitry 605 has encoded the data to achieve a target weight range or target weight, the encoding circuitry 605 may send the encoded data packet, encoding bits, and/or padding bits to the memory array 670. The memory array 670 may store the data to memory cells within the memory array 670.

In some examples, the memory device 600 may output data to a host device based on a read request sent by the host device. The memory array 670 may output an encoded version of data to the decoding circuitry 610 in response to the request sent by the host device. The index decoder 630 may decode the indication stored in the encoding segment to determine which segments were inverted. For example, index decoder 630 may decode the indication and determine that the first five (5) out of eight (8) segments were inverted. The index decoder 630 may then send the decoded indication to the inverting circuitry 620-*b*. The inverting circuitry 620-*b* may then reinvert (and thereby uninvert) the segments that were inverted during the encoding process (e.g., segments 1 through 5). The memory device 600 may subsequently send the decoded data packet (e.g., the originally received data packet) to the host device. In some examples, the memory device 600 may send the encoded data packet (e.g., as stored in the memory array 670, with a weight within the target weight range or equal to the target weight) along with the indication of the last-inverted segment (or that no segment was inverted) directly to the host device or another external device, and index decoding and/or inverting circuitry located at the host may be used to read the encoded data packet.

Figure 7:
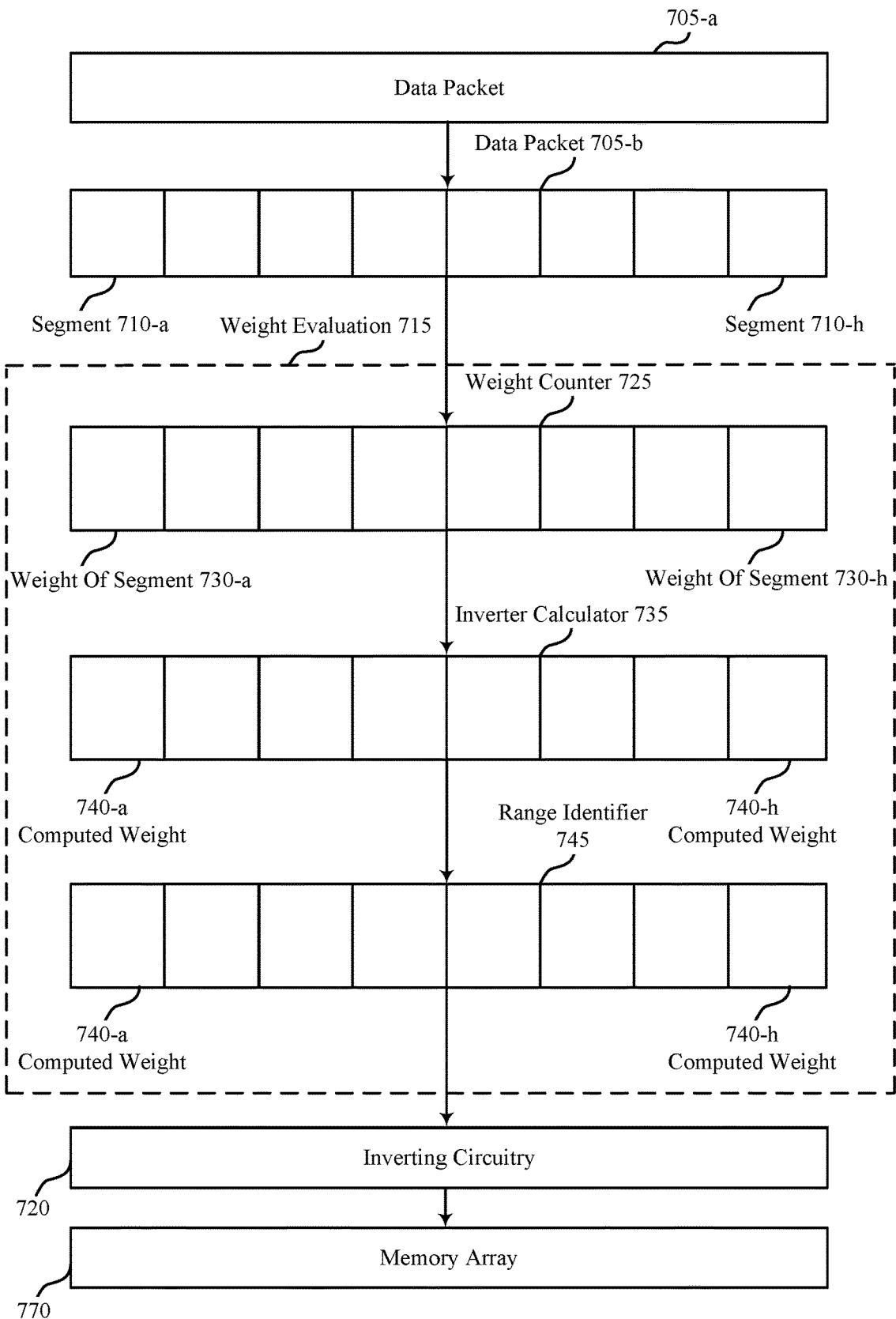
FIG. 7 illustrates an example of an encoder that supports balancing data for storage in a memory device in accordance with examples as disclosed herein.

FIG. 7 illustrates operations of an encoder 700 that supports balancing data for storage in a memory device in accordance with examples as disclosed herein. Encoder 700 may be an example of encoding circuitry 605, as described with reference to FIG. 6, for example. For example, weight evaluation circuitry 715 may be an example of weight evaluation circuitry 615; inverting circuity 720 may be an example of inverting circuitry 620; and memory array 770 may be an example of memory array 170 and/or memory array 670 as described with reference to FIGS. 1 and 6. Additionally, weight evaluation circuitry 715 may include a weight counter 725, an inverter calculator 735, and a range identifier 745.

Encoder 700 may receive data packet 705-*a* as transmitted by a host device and encode the data such that a target weight or target weight range is achieved. In some examples, the encoder 700 may divide (e.g., virtually or physically) the data packet 705-*a* into segments 710-*a* to 710-*h* resulting in the data packet 705-*b*. In other examples, the encoder may receive data packet 705-*b*—e.g., the host device may send the data packet 705-*b* such that it is already divided in segments 710-*a* to 710-*h* as described herein and with reference to FIG. 6.

The data packet 705-*b* may be sent to the weight evaluation circuitry 715 and the weight counter 725. The weight counter 725 may calculate a weight of each segment 710—e.g., weight of segment 730-*a* may be the weight associated with the segment 710-*a* while the weight of segment 730-*h* may be the weight associated with the segment 710-*h*. The weight counter 725 may also calculate a weight of data packet 705-*b*. The weight counter 725 may then send the weight of segments 730 to the inverter calculator 735.

Inverter calculator 735 may calculate computed weights 740 that are associated with each inversion possibility for data packet 705-*b*. That is, with eight (8) segments in data packet 705-*b*, there may be eight (8) different inversion possibilities—e.g., inverting just the first segment, inverting the first and second segment, and so on until all eight (8) segments are inverted. A computed weight 740-*a* may be the weight associated with the first inverting possibility (e.g., inverting just the first segment) while computed weight 740-*h* may be the weight associated with the last inverting possibility (e.g., inverting all eight (8) segments.) Thus, the inverter calculator 735 may calculate the weight associated with each possibility and send the information to the range identifier 745.

Before receiving the information from the inverter calculator 735, range identifier 745 may be configured with a target weight range or target weight. In some cases, the target weight may be equivalent to N/2 or be a power of two (2). In some cases, the target weight range may be configured to ensure that a nonrepeating inversion operation is guaranteed to achieve the range. After receiving the information from inverter calculator 735 and/or weight evaluation circuitry 715, the range identifier 745 may determine if any of the computed weights 740 are in the target weight range or meet the target weight. That is, the range identifier 745 may first check if data packet 705-*b* was within the range, then if the computed weight 740-*a* is within the range, and then if computed weight 740-*b* is within the range (e.g., the possibility of inverting the first and second segments), and so on.

The range identifier 745 may then determine which possibility is the first to achieve the target weight or target weight range. For example, the range identifier 745 may determine that inverting the first five (5) segments 710 may achieve the target weight range, as described herein and with reference to FIG. 4. The range identifier 745 may then send the information regarding the first possibility (e.g. inverting the first five (5) segments) to the inverting circuitry 720. In some cases, the range identifier 745 sends an index associated with the fifth segment to indicate that a weight of an encoded data packet will fall within the target weight range if the first five (5) segments are inverted. Inverting circuitry 720 may then invert the segments, as described herein and with reference to FIG. 4.

Inverting circuitry 720 may also append to the encoded data packet an indicator of the index associated with the last-inverted segment (e.g., the fifth segment), or that no segments were inverted. The memory device may store the indicator in an encoding segment, as described herein and with reference to FIGS. 3 and 4. The inverting circuitry 720 may store the index in a binary fashion such that a $\lceil \log_2 r \rceil$ of bits is needed to store the index in the encoding segment to encapsulate all the inversion possibilities. Additionally, the values for index i may be between 1 to r+1 or from 0 to r. For example, if a page is divided into seven (7) segments, r=7 and the formula $\lceil \log_2(r+1) \rceil$ would calculate that the memory device needs three (3) bits to uniquely identify each of the indices along with the possibility that no segment was inverted.

For example, when the page is divided into seven (7) segments and uses three (3) bits to store the information, the following table (e.g., Table 1) may be one example of how each index is represented:

TABLE 1

| Segment inversions | $i_1$ | $i_2$ | $i_3$ |
|---|---|---|---|
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

The variables $i_1$, $i_2$, and $i_3$, may represent the binary values associated with the index i, where $i_1$ may represent the most significant bit. For example, when none of the segments are inverted, the index bits $i_1$, $i_2$, and $i_3$ may all have a value of 0. When the first segment is inverted, the index bits $i_1$ and $i_2$ may have a value 0 while the index bit $i_3$ may have a value of 1, when the first and second segments are inverted, index bit $i_1$ and $i_3$ may have a value of 0 while index bit $i_2$ may have a value of 1, and so on. The inverting circuitry 720 may then send the encoded data and the encoding bits (e.g., the index) to the memory array 770 as described herein and with reference to FIG. 6. In some examples, the encoder 700 may be included in the memory array 770.

Figure 8:
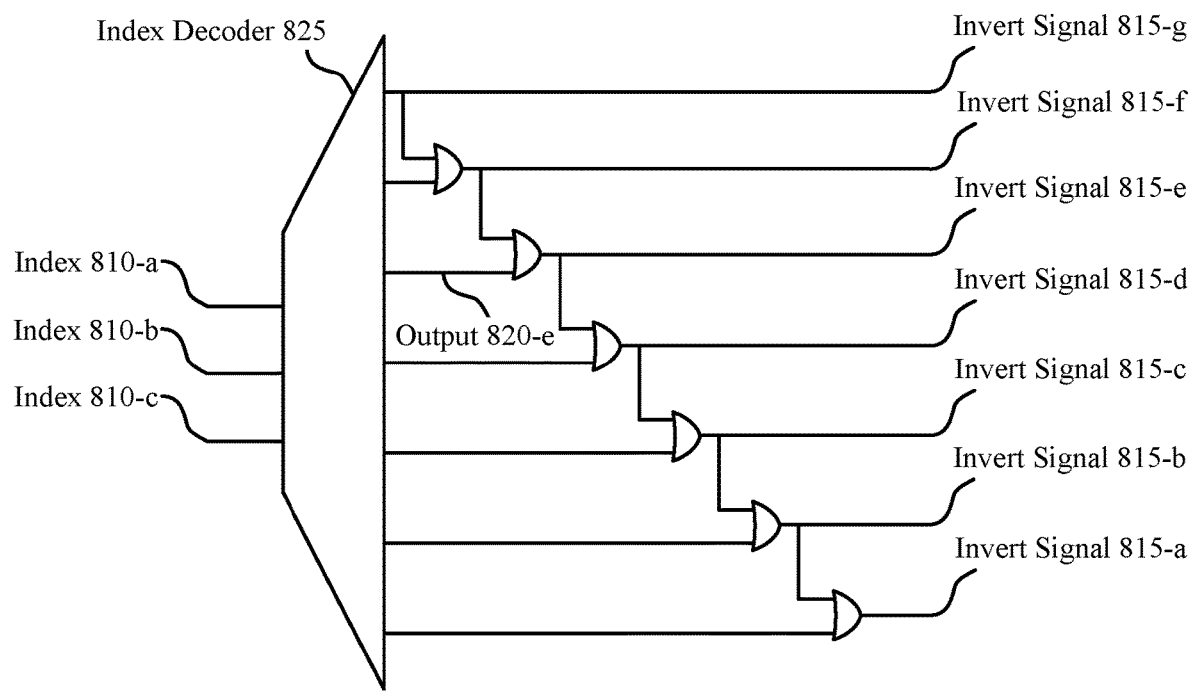
FIG. 8 illustrates an example of an index decoder that supports balancing data for storage in a memory device in accordance with examples as disclosed herein.

FIG. 8 illustrates an example of a decoder 800 that supports balancing data for storage in a memory device in accordance with examples as disclosed herein. Decoder 800 may include aspects or be an example of the decoding circuitry 610 as described with reference to FIG. 6. Decoder 800 may receive index bit 810-a, index bit 810-b, and index bit 810-c (e.g., index bits $i_1$, $i_2$, and $i_3$ as described with reference to FIG. 7). Decoder 800 may include an index decoder 825 (e.g., an example of index decoder 630 as described with reference to FIG. 6) and generate invert signals 815. The index decoder 825 may also generate an output 820 associated with each invert signal 815—e.g., output 820-e may be associated with the invert signal 815-e.

As described herein and with reference to FIGS. 3 through 7, a memory device may encode data received from a host device (e.g., host device 105) before storing the data in a memory array. That is, the memory device may select a target weight or target weight range such that implementing a generalized Knuth algorithm and performing a non-repeating inversion may guarantee that the target weight range or target weight is achieved. The memory device may also store an indication of the last-inverted segment before the target weight or target weight range is achieved or that no segments were inverted, where the indication may comprise index bits $i_1$, $i_2$, and $i_3$. As described herein and with reference to FIG. 6, a memory device may also receive a read command from the host device and decode the encoded data before outputting the data to the host device. The memory device may use the decoder 800 to decode the data.

As described herein and with reference to FIG. 7, a memory device may store an index associated with the last inverted segment before a target weight range is achieved with an encoded data packet—e.g., by appending the index at an end of the data packet. For example, when a page (e.g., the data packet received from the host) is divided into seven (7) segments, the memory device may store three (3) index bits in the encoding segment. In other examples, the memory device may use a different quantity of bits to represent the indices based on the quantity of segments and quantity r.

In this example, a page may be divided into seven (7) segments and the indication may be stored using three (3) index bits. As described herein and with reference to FIG. 6 (e.g., the index decoder 630), the index decoder 825 may receive the index bits 810 and decode them so that the encoded version of the data can be modified to result in the originally received page. The index bits 810 may have a value as shown in Table 1 with reference to FIG. 7. In some examples, index decoder 825 may be an AND gate that combines the index bits 810 to generate an output 820 that passes through several OR gates resulting in the inverting signals 815. Each invert signal 815 may indicate whether a corresponding segment needs to be inverted or not as part of the decoding operation—e.g., when invert signal 815-a signals a logic value of 1, the invert signal 815-a may indicate the first segment is to be inverted, when invert signal 815-b signals a logic value of 1, the invert signal 815-b may indicate the second segment is to be inverted, and so on. When no segments were inverted during the encoding phase, each output 820 of the index decoder 825 may signal a logic value of 0, and each invert signal 815 generated by the decoder may signal a logic value of 0.

In another example, when the fifth segment is the last inverted segment, index bit 810-a may have a value 1 while index bit 810-b and index bit 810-c may have value 0, as described with reference to FIG. 7. The index decoder 825 may generate the output 820-e by taking the AND value of index bit 810-a, inverted index bit 810-b, and inverted index bit 810-c, and thus output 820-e may represent a logic value 1. The other outputs 820 may be generated and outputted such that they all represent a logic value 0. This may generate a logic value of 1 at the invert signal 815-e via the OR gate connected to the output 820-e. When the output at invert signal 815-e is at 1, the value of invert signals 815-a through 815-d may also be at logic value 1 based on the implementation of the OR gates. As the logic value is 0 at the other outputs 820, the value of invert signal 815-f and invert signal 815-g may also be at a logic value 0. Thus, the decoder 800 may generate a signal that indicates that a first segment to a fifth segment of a data packet are to be inverted. Using a similar approach to decode all the other possible index bits 810, the following table (e.g., Table 2) may be one example of how each invert signal 815 is calculated:

TABLE 2

Invert Signal Values

Invert Signal 815-g = AND (Index bit 810-a, Index bit 810-b, Index bit 810-c)
Invert Signal 815-f = Invert Signal 815-g + AND (Index bit 810-a, Index bit 810-b, $\overline{\text{Index 810-c}}$)
Invert Signal 815-e = Invert Signal 815-f + AND (Index bit 810-a, $\overline{\text{Index 810-b}}$, Index bit 810-c)
Invert Signal 815-d = Invert Signal 815-e + AND (Index bit 810-a, $\overline{\text{Index 810-b}}$, $\overline{\text{Index 810-c}}$)
Invert Signal 815-c = Invert Signal 815-d + AND ($\overline{\text{Index 810-a}}$, Index bit 810-b, Index bit 810-c)
Invert Signal 815-b = Invert Signal 815-c + AND ($\overline{\text{Index 810-a}}$, Index bit 810-b, $\overline{\text{Index 810-c}}$)
Invert Signal 815-a = Invert Signal 815-b + AND ($\overline{\text{Index 810-a}}$, $\overline{\text{Index 810-b}}$, Index bit 810-c)

The inverted values of the respective indices may be represented by $\overline{\text{Index810-a}}$, $\overline{\text{Index810-b}}$, and $\overline{\text{Index810-c}}$. It should be noted that this is just one example of how index decoder 825 may decode the data and invert the segments resulting in the original unmodified data. In other examples, index decoder 825 may implement a different process. For example, in the above decoding operation, the logic value 1 may replace the logic value 0, AND gates might replace the OR gates, and invert signals 815 may be configured such that an inversion occurs if the logic value is 0 rather than 1. In other examples, index decoder 825 may implement a different decoding process. After the decoder 800 decodes the data, index decoder 825 may output the decoded information to an inverting circuitry which reinverts the segments resulting in the original data (e.g., as described with reference to FIG. 6) The memory device may then output the decoded data to the host device as described herein and with reference to FIG. 6.

Figure 9:
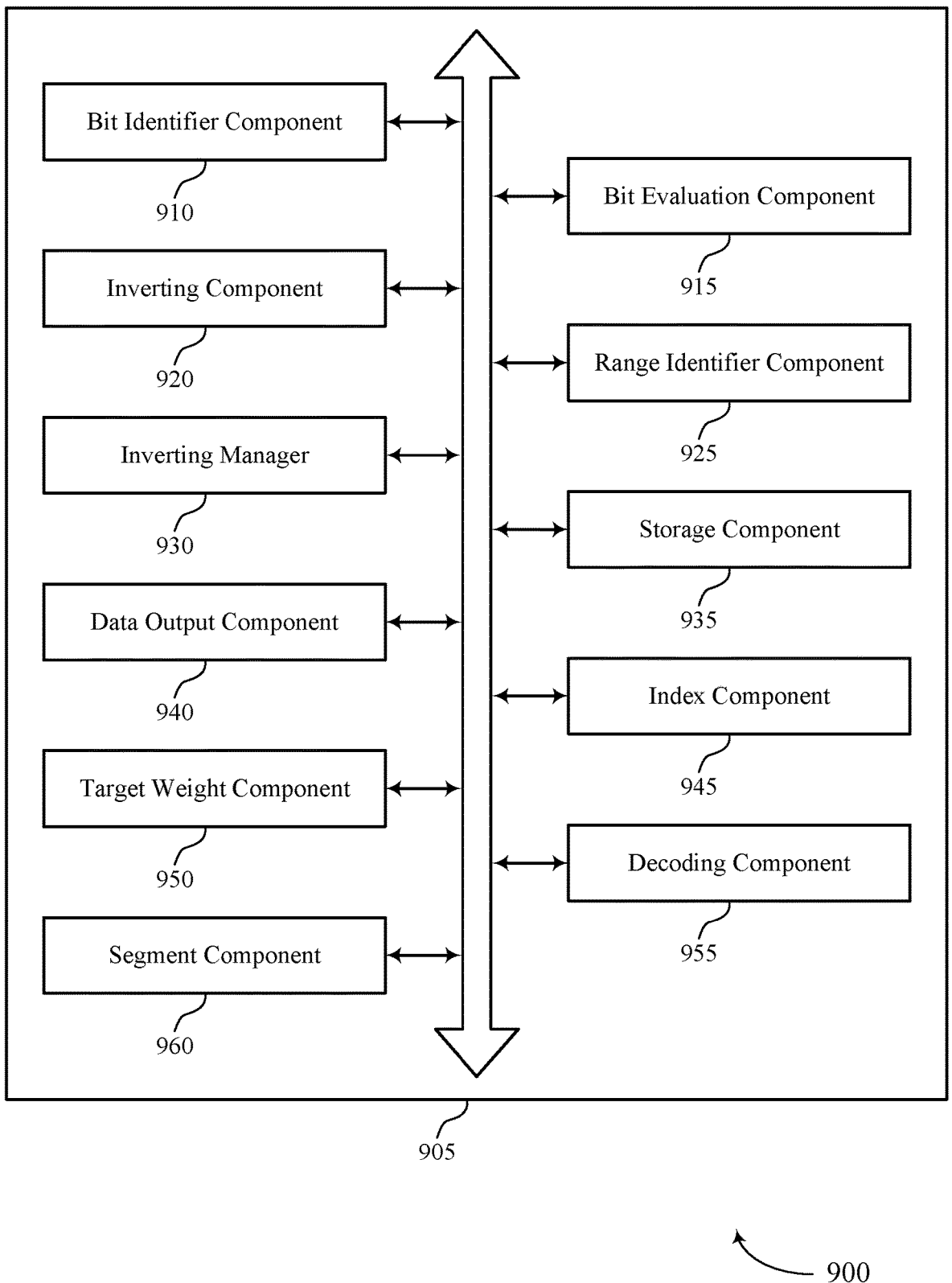
FIG. 9 shows a block diagram of a memory device that supports balancing data for storage in a memory device in accordance with aspects of the present disclosure.

FIG. 9 shows a block diagram 900 of a memory device 905 that supports balancing data for storage in a memory device in accordance with examples as disclosed herein. The memory device 905 may be an example of aspects of a memory device as described with reference to FIGS. 1 through 8. The memory device 905 may include a bit identifier component 910, a bit evaluation component 915, an inverting component 920, a range identifier component 925, an inverting manager 930, a storage component 935, a data output component 940, an index component 945, a target weight component 950, a decoding component 955, and a segment component 960. Each of these modules may communicate, directly or indirectly, with one another (e.g., via one or more buses).

The bit identifier component 910 may receive, at a device that includes a memory array, data that includes a set of bits and is partitioned into a set of segments, where each bit of the set of bits has one of a first value or a second value, and where a set of indices is assigned to the set of segments. In some examples, receiving, for storage in a memory array, data that includes a set of bits and is partitioned into a set of segments, where each bit of the set of bits has a first value or a second value, and where a set of indices is assigned to the set of segments.

The bit evaluation component 915 may determine that the data includes a first quantity of bits having the first value, the first quantity of bits being outside of a range that is based on a quantity of bits in the set of bits and a quantity of segments in the set of segments. In some examples, the bit evaluation component determining that the data includes an initial quantity of bits having the first value. In some cases, bit evaluation component 915 may determine, after each inversion of one segment of the set of segments, that the data includes a respective quantity of bits having the first value. In some instances, the bit evaluation component 915 may determine the initial quantity of bits having the first value based on counting, within the set of bits, each bit having the first value.

The inverting component 920 may invert, based on the first quantity of bits being outside of the range, a first segment of the set of segments in accordance the set of indices, where the data includes a second quantity of bits having the first value after the first segment is inverted. In some examples, invert, based on the initial quantity being outside the range, one segment of the set of segments at a time in accordance with the set of indices and until the data includes an adjusted set of bits that includes an adjusted quantity of bits having the first value, the adjusted quantity of bits being within the range. In some cases, invert, based on the third quantity of bits being outside of the range, a third segment of the set of segments in accordance with the set of indices, where the data includes a fourth quantity of bits having the first value after the third segment is inverted, the fourth quantity of bits being within the range.

The range identifier component 925 may determine that the second quantity of bits is outside of the range. In some examples, the range identifier component 925 may determine that the initial quantity of bits is outside of a range that is based on a quantity of bits in the set of bits and a quantity of segments in the set of segments. In some cases, determining that the third quantity of bits is within the range, where the data includes a third set of bits after the second segment is inverted. In some instances, determining that the third quantity of bits is within the range, where the data includes a third set of bits after the second segment is inverted. In some examples, determining that the third quantity of bits is outside of the range, where the data includes a third set of bits after the second segment is inverted. In some cases, the range identifier component 925 may configure a span of the range to ensure that inverting at least a subset of the set of segments results in the data including an adjusted quantity of bits having the first value that is within the range. In some instances, shift a bound of the range, where the range includes a value equal to half the quantity of bits in the set of bits based on the shifting.

In some examples, the range identifier component 925 may compare, after each inversion of one segment of the set of segments, the respective quantity of bits with the range, where a subsequent segment of the set of segments is inverted based on the respective quantity of bits being outside of the range. In some examples, the range identifier component 925 may determine a span of the range based on a quantity of bits included in each segment of the set of segments, where inverting the set of segments in accordance with the set of indices results in the adjusted quantity of bits being within the range based on the span of the range. In some cases, shift the range, where the shifted range includes a value equal to half the quantity of bits in the set of bits based on the shifting. In some instances, the span of the range is based on a quantity of bits included in each segment of the set of segments. In some examples, an upper limit of the range is based on the quantity of bits in the set of bits and the quantity of segments in the set of segments.

The inverting manager 930 may invert, based on the second quantity of bits being outside of the range, a second segment of the set of segments in accordance with the set of indices, where the data includes a third quantity of bits having the first value after the second segment is inverted.

The storage component 935 may write the adjusted set of bits to the memory array based on the adjusted quantity of bits being within the range. In some examples, the storage component 935 may store the third set of bits in the memory array based on the third quantity being within the range. In some cases, the storage component 935 may receive a request for the data. In some instances, the storage component 935 may receive a request for the data.

The data output component 940 may output from the memory array, based on the request, the third set of bits and the value corresponding to the index for the second segment. In some examples, the data output component 940 may output, from the device, the set of bits in response to the request for the data. In some cases, the data output component 940 may output from the memory array, based on the request, the adjusted set of bits and the indication of the index for the last-inverted segment. In some instances, the data output component 940 may output, from a device that includes the memory array, the set of bits in response to the request for the data.

The index component 945 may store, in the memory array, a value corresponding to an index for the second segment. In some examples, the index component 945 may identify the value corresponding to the index for the second segment based on the outputting. In some cases, the index component 945 may store, in the memory array and based on the adjusted quantity of bits being within the range, an indication of an index for a last-inverted segment. In some instances, the index component 945 may order the indexes such that the order may include a consecutive ordering of the set of indices that includes a single instance of each index of the set of indices, or a non-consecutive ordering of the set of indices that includes a single instance of each index of the set of indices. In some cases, the inverting is performed in accordance with an ordering of the set of indices, the ordering including a single instance of each index of the set of indices.

The target weight component 950 may determine, based on the third quantity of bits being within the range, a difference between a target quantity of bits and the third quantity of bits, the target quantity of bits equal to half the quantity of bits in the set of bits. In some examples, increasing or decreasing, based on the difference between the target quantity of bits and the third quantity of bits, a quantity of bits in the third segment having the first value, where the data includes the target quantity of bits having the first value based on the increasing or decreasing.

The decoding component 955 may invert, for the third set of bits and based on the value, the first segment and the second segment to obtain the set of bits. In some examples, the decoding component 955 may invert one or more additional segments each having a respective index that, according to an order of the set of indices, is between an index for the first segment and the index for the second segment, where the set of bits is obtained based on inverting the one or more additional segments. In some cases, the decoding component 955 may invert, for the adjusted set of bits, each segment of the set of segments having a respective index that, according to an order of the set of indices, matches or is earlier than the index for the last-inverted segment, where the set of bits is obtained based on the inverting.

The segment component 960 may determine the quantity of segments in the set of segments. In some examples, the segment component 960 may partition the data into the set of segments based on the quantity of segments in the set of segments.

Figure 10:
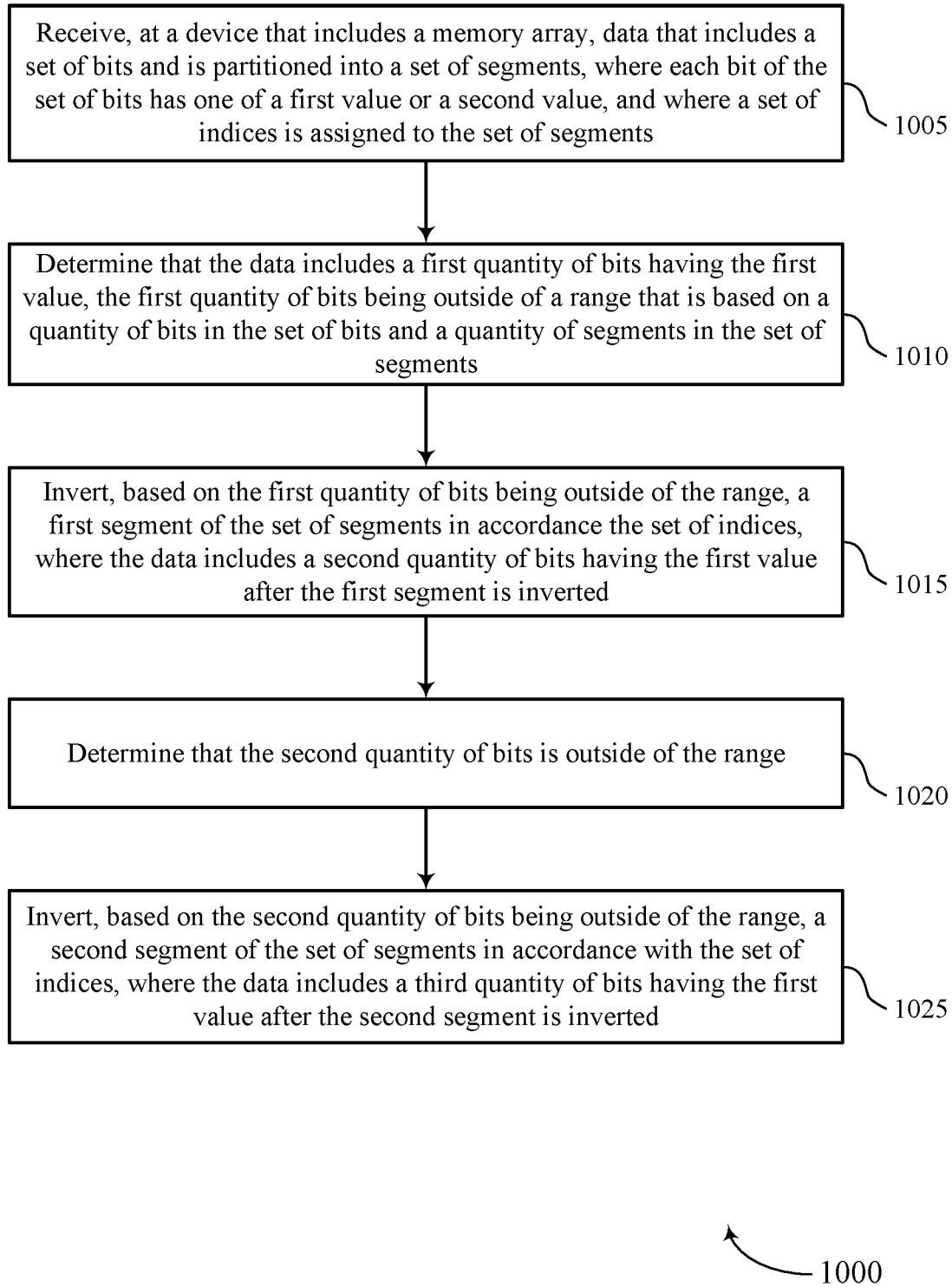
FIGS. 10 and 11 show flowcharts illustrating a method or methods that support balancing data for storage in a memory device in accordance with examples as disclosed herein.

FIG. 10 shows a flowchart illustrating a method or methods 1000 that supports balancing data for storage in a memory device in accordance with aspects of the present disclosure. The operations of method 1000 may be implemented by a memory device or its components as described herein. For example, the operations of method 1000 may be performed by a memory device as described with reference to FIG. 9. In some examples, a memory device may execute a set of instructions to control the functional elements of the memory device to perform the described functions. Additionally, or alternatively, a memory device may perform aspects of the described functions using special-purpose hardware.

At 1005, the memory device may receive, at a device that includes a memory array, data that includes a set of bits and is partitioned into a set of segments, where each bit of the set of bits has one of a first value or a second value, and where a set of indices is assigned to the set of segments. The operations of 1005 may be performed according to the methods described herein. In some examples, aspects of the operations of 1005 may be performed by a bit identifier component as described with reference to FIG. 9.

At 1010, the memory device may determine that the data includes a first quantity of bits having the first value, the first quantity of bits being outside of a range that is based on a quantity of bits in the set of bits and a quantity of segments in the set of segments. The operations of 1010 may be performed according to the methods described herein. In some examples, aspects of the operations of 1010 may be performed by a bit evaluation component as described with reference to FIG. 9.

At 1015, the memory device may invert, based on the first quantity of bits being outside of the range, a first segment of the set of segments in accordance the set of indices, where the data includes a second quantity of bits having the first value after the first segment is inverted. The operations of 1015 may be performed according to the methods described herein. In some examples, aspects of the operations of 1015 may be performed by an inverting component as described with reference to FIG. 9.

At 1020, the memory device may determine that the second quantity of bits is outside of the range. The operations of 1020 may be performed according to the methods described herein. In some examples, aspects of the operations of 1020 may be performed by a range identifier component as described with reference to FIG. 9.

At 1025, the memory device may invert, based on the second quantity of bits being outside of the range, a second segment of the set of segments in accordance with the set of indices, where the data includes a third quantity of bits having the first value after the second segment is inverted. The operations of 1025 may be performed according to the methods described herein. In some examples, aspects of the operations of 1025 may be performed by an inverting manager as described with reference to FIG. 9.

In some examples, an apparatus as described herein may perform a method or methods, such as the method 1000. The apparatus may include features, means, or instructions (e.g., a non-transitory computer-readable medium storing instructions executable by a processor) for receiving, at a device that includes a memory array, data that includes a set of bits and is partitioned into a set of segments, where each bit of the set of bits has one of a first value or a second value, and where a set of indices is assigned to the set of segments. The apparatus may further include features, means, or instructions for determining that the data includes a first quantity of bits having the first value, the first quantity of bits being outside of a range that is based on a quantity of bits in the set of bits and a quantity of segments in the set of segments, inverting, based on the first quantity of bits being outside of the range, a first segment of the set of segments in accordance the set of indices, where the data includes a second quantity of bits having the first value after the first segment is inverted. The apparatus may also further include features, means, or instructions for determining that the second quantity of bits is outside of the range, and inverting, based on the second quantity of bits being outside of the range, a second segment of the set of segments in accordance with the set of indices, where the data includes a third quantity of bits having the first value after the second segment is inverted.

Some examples of the method 1000 and the apparatus described herein may further include operations, features, means, or instructions for determining that the third quantity of bits may be within the range, where the data includes a third set of bits after the second segment may be inverted, and storing the third set of bits in the memory array based on the third quantity being within the range.

Some cases of the method 1000 and the apparatus described herein may further include operations, features, means, or instructions for storing, in the memory array, a value corresponding to an index for the second segment, receiving a request for the data, and outputting from the memory array, based on the request, the third set of bits and the value corresponding to the index for the second segment.

Some instances of the method 1000 and the apparatus described herein may further include operations, features, means, or instructions for identifying the value corresponding to the index for the second segment based on the outputting, inverting, for the third set of bits and based on the value, the first segment and the second segment to obtain the set of bits, and outputting, from the device, the set of bits in response to the request for the data.

Some examples of the method 1000 and the apparatus described herein may further include operations, features, means, or instructions for inverting one or more additional segments each having a respective index that, according to an order of the set of indices, may be between an index for the first segment and the index for the second segment, where the set of bits may be obtained based on inverting the one or more additional segments.

In some cases of the method 1000 and the apparatus described herein, a third segment of the set of segments may include operations, features, means, or instructions for determining that the third quantity of bits may be within the range, where the data includes a third set of bits after the second segment may be inverted, determining, based on the third quantity of bits being within the range, a difference between a target quantity of bits and the third quantity of bits, the target quantity of bits equal to half the quantity of bits in the set of bits, and increasing or decreasing, based on the difference between the target quantity of bits and the third quantity of bits, a quantity of bits in the third segment having the first value, where the data includes the target quantity of bits having the first value based on the increasing or decreasing.

Some instances of the method 1000 and the apparatus described herein may further include operations, features, means, or instructions for determining that the third quantity of bits may be outside of the range, where the data includes a third set of bits after the second segment may be inverted, and inverting, based on the third quantity of bits being outside of the range, a third segment of the set of segments in accordance with the set of indices, where the data includes a fourth quantity of bits having the first value after the third segment may be inverted, the fourth quantity of bits being within the range.

In some examples of the method 1000 and the apparatus described herein, a consecutive ordering of the set of indices that includes a single instance of each index of the set of indices, or, and a non-consecutive ordering of the set of indices that includes a single instance of each index of the set of indices.

Some cases of the method 1000 and the apparatus described herein may further include operations, features, means, or instructions for configuring a span of the range to ensure that inverting at least a subset of the set of segments results in the data including an adjusted quantity of bits having the first value that may be within the range.

In some instances of the method 1000 and the apparatus described herein, the span of the range may be based on a quantity of bits included in each segment of the set of segments.

Some examples of the method 1000 and the apparatus described herein may further include operations, features, means, or instructions for shifting a bound of the range, where the range includes a value equal to half the quantity of bits in the set of bits based on the shifting.

Figure 11:
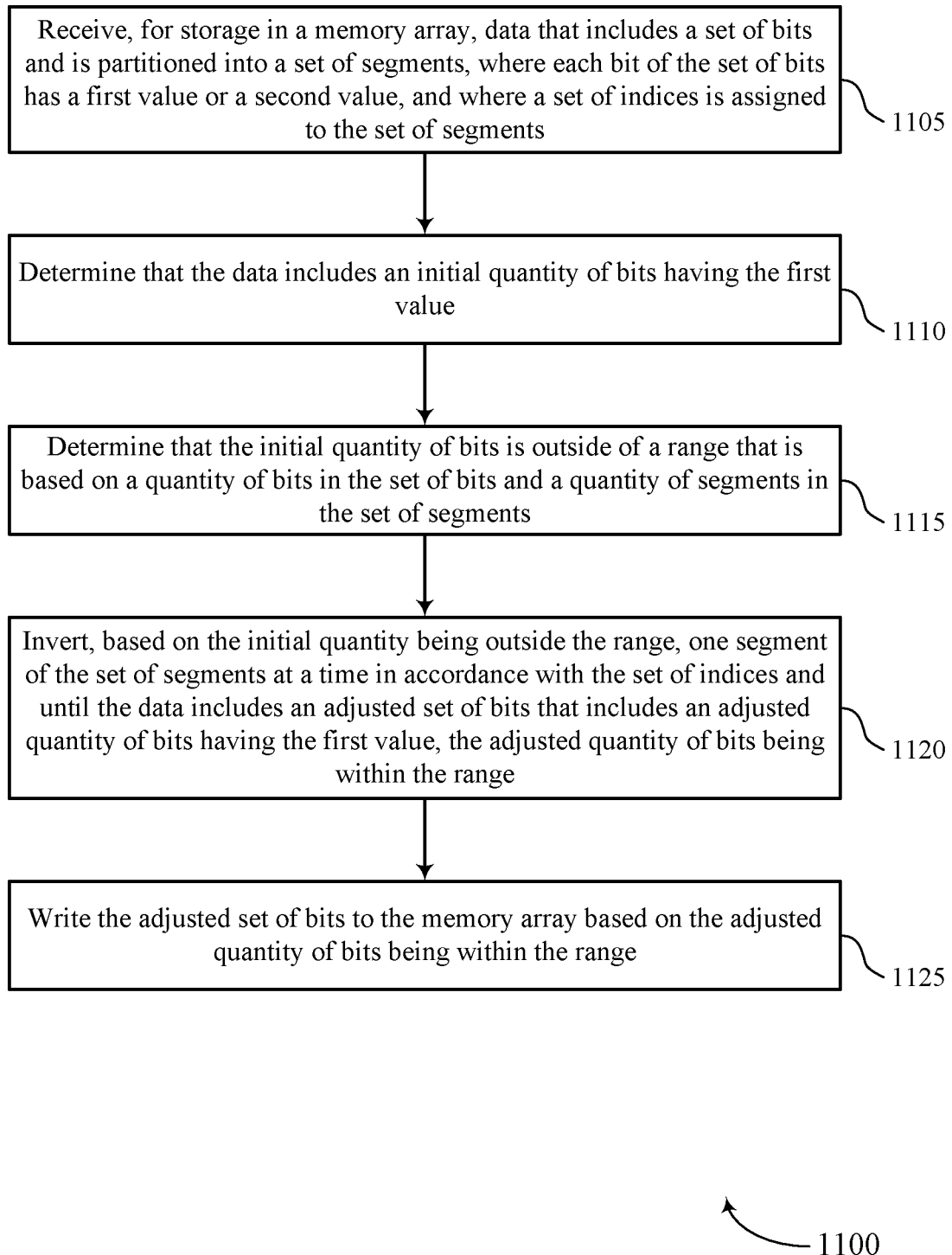

FIG. 11 shows a flowchart illustrating a method or methods 1100 that supports balancing data for storage in a memory device in accordance with aspects of the present disclosure. The operations of method 1100 may be implemented by a memory device or its components as described herein. For example, the operations of method 1100 may be performed by a memory device as described with reference to FIG. 9. In some examples, a memory device may execute a set of instructions to control the functional elements of the memory device to perform the described functions. Additionally, or alternatively, a memory device may perform aspects of the described functions using special-purpose hardware.

At 1105, the memory device may receive, for storage in a memory array, data that includes a set of bits and is partitioned into a set of segments, where each bit of the set of bits has a first value or a second value, and where a set of indices is assigned to the set of segments. The operations of 1105 may be performed according to the methods described herein. In some examples, aspects of the operations of 1105 may be performed by a bit identifier component as described with reference to FIG. 9.

At 1110, the memory device may determine that the data includes an initial quantity of bits having the first value. The operations of 1110 may be performed according to the methods described herein. In some examples, aspects of the operations of 1110 may be performed by a bit evaluation component as described with reference to FIG. 9.

At 1115, the memory device may determine that the initial quantity of bits is outside of a range that is based on a quantity of bits in the set of bits and a quantity of segments in the set of segments. The operations of 1115 may be performed according to the methods described herein. In some examples, aspects of the operations of 1115 may be performed by a range identifier component as described with reference to FIG. 9.

At 1120, the memory device may invert, based on the initial quantity being outside the range, one segment of the set of segments at a time in accordance with the set of indices and until the data includes an adjusted set of bits that includes an adjusted quantity of bits having the first value, the adjusted quantity of bits being within the range. The operations of 1120 may be performed according to the methods described herein. In some examples, aspects of the operations of 1120 may be performed by an inverting component as described with reference to FIG. 9.

At 1125, the memory device may write the adjusted set of bits to the memory array based on the adjusted quantity of bits being within the range. The operations of 1125 may be performed according to the methods described herein. In some examples, aspects of the operations of 1125 may be performed by a storage component as described with reference to FIG. 9.

In some examples, an apparatus as described herein may perform a method or methods, such as the method 1100. The apparatus may include features, means, or instructions (e.g., a non-transitory computer-readable medium storing instructions executable by a processor) for receiving, for storage in a memory array, data that includes a set of bits and is partitioned into a set of segments, where each bit of the set of bits has a first value or a second value, and where a set of indices is assigned to the set of segments The apparatus may further include features, mean, or instructions for determining that the data includes an initial quantity of bits having the first value, determining that the initial quantity of bits is outside of a range that is based on a quantity of bits in the set of bits and a quantity of segments in the set of segments, inverting, based on the initial quantity being outside the range, one segment of the set of segments at a time in accordance with the set of indices and until the data includes an adjusted set of bits that includes an adjusted quantity of bits having the first value, the adjusted quantity of bits being within the range, and writing the adjusted set of bits to the memory array based on the adjusted quantity of bits being within the range.

Some examples of the method 1100 and the apparatus described herein may further include operations, features, means, or instructions for determining, after each inversion of one segment of the set of segments, that the data includes a respective quantity of bits having the first value, and comparing, after each inversion of one segment of the set of segments, the respective quantity of bits with the range, where a subsequent segment of the set of segments may be inverted based on the respective quantity of bits being outside of the range.

Some cases of the method 1100 and the apparatus described herein may further include operations, features, means, or instructions for storing, in the memory array and based on the adjusted quantity of bits being within the range, an indication of an index for a last-inverted segment, receiving a request for the data, and outputting from the memory array, based on the request, the adjusted set of bits and the indication of the index for the last-inverted segment.

Some instances of the method 1100 and the apparatus described herein may further include operations, features, means, or instructions for inverting, for the adjusted set of bits, each segment of the set of segments having a respective index that, according to an order of the set of indices, matches or may be earlier than the index for the last-inverted segment, where the set of bits may be obtained based on the inverting, and outputting, from a device that includes the memory array, the set of bits in response to the request for the data.

Some examples of the method 1100 and the apparatus described herein may further include operations, features, means, or instructions for determining a span of the range based on a quantity of bits included in each segment of the set of segments, where inverting the set of segments in accordance with the set of indices results in the adjusted quantity of bits being within the range based on the span of the range.

In some cases of the method 1100 and the apparatus described herein, an upper limit of the range may be based on the quantity of bits in the set of bits and the quantity of segments in the set of segments.

Some instances of the method 1100 and the apparatus described herein may further include operations, features, means, or instructions for shifting the range, where the shifted range includes a value equal to half the quantity of bits in the set of bits based on the shifting.

Some examples of the method 1100 and the apparatus described herein may further include operations, features, means, or instructions for determining the initial quantity of bits having the first value based on counting, within the set of bits, each bit having the first value.

In some cases of the method 1100 and the apparatus described herein, the inverting may be performed in accordance with an ordering of the set of indices, the ordering including a single instance of each index of the set of indices.

Some instances of the method 1100 and the apparatus described herein may further include operations, features, means, or instructions for determining the quantity of segments in the set of segments, and partitioning the data into the set of segments based on the quantity of segments in the set of segments.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array, a memory controller that is coupled with the memory array and is operable to cause the apparatus to, determine that the data includes a first quantity of bits having the first value, the first quantity of bits being outside of a range that is based on a quantity of bits in the set of bits and a quantity of segments in the set of segments, invert, based on the first quantity of bits being outside of the range. The apparatus may further include a first segment of the set of segments in accordance the set of indices, where the data includes a second quantity of bits having the first value after the first segment is inverted, determine that the second quantity of bits is outside of the range, and invert, based on the second quantity of bits being outside of the range, a second segment of the set of segments in accordance with the set of indices, where the data includes a third quantity of bits having the first value after the second segment is inverted.

Some examples may further include determining that the third quantity of bits may be within the range and storing the data in the memory array based on the third quantity of bits being within the range, where the data includes a third set of bits after the second segment may be inverted.

Some cases may further include storing, in the memory array, a value corresponding to an index for the second segment, receive a request for the data, and output, based on the request, the third set of bits and the value corresponding to the index for the second segment.

Some instances may further include determining that the third quantity of bits may be outside of the range, where the data includes a third set of bits after the second segment may be inverted, and invert, based on the third quantity of bits being outside of the range, a third segment of the set of segments in accordance with the set of indices, where the data includes a fourth quantity of bits having the first value after the third segment may be inverted, the fourth quantity of bits being within the range.

Some examples may further include storing, in the memory array and based on the adjusted quantity of bits being within the range, an indication of an index assigned to a last inverted segment, receive a request for the data, and output, based on the request, the adjusted set of bits and the indication of the index.

An apparatus is described. The apparatus may include a memory array, a memory controller that is coupled with the memory array and is operable to cause the apparatus to, determine that the data includes an initial quantity of bits having the first value, determine that the initial quantity of bits is outside of a range that is based on a quantity of bits in the set of bits and a quantity of segments in the set of segments. The apparatus may further include features, means, or instructions for inverting, based on the initial quantity of bits being outside the range, one segment of the set of segments at a time in accordance with the set of indices and until the data includes an adjusted set of bits that includes an adjusted quantity of bits having the first value, the adjusted quantity of bits within the range, and write the adjusted set of bits to the memory array based on the adjusted quantity of bits being within the range.

Some examples may further include determining, after each inversion of one segment of the set of segments, that the data includes a respective quantity of bits having the first value, and compare, after each inversion of one segment of the set of segments, the respective quantity of bits with the range, where a subsequent segment of the set of segments may be inverted based on the respective quantity of bits being outside of the range.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, at a device that comprises a memory array, data that comprises a plurality of bits and is partitioned into a plurality of segments, wherein each bit of the plurality of bits is associated with a respective bit weight, and wherein a plurality of indices is assigned to the plurality of segments;
   determining that the data has a first cumulative bit weight, the first cumulative bit weight being outside of a range that is based at least in part on a quantity of bits in the plurality of bits; and
   inverting, based at least in part on the first cumulative bit weight being outside of the range, a first segment of the plurality of segments in accordance with the plurality of indices, wherein the data has a second cumulative bit weight after the first segment is inverted.

2. The method of claim 1, further comprising:
   determining that the second cumulative bit weight is within the range, wherein the data comprises a second plurality of bits after the first segment is inverted; and
   storing the second plurality of bits in the memory array based at least in part on the second cumulative bit weight being within the range.

3. The method of claim 2, further comprising:
   storing, in the memory array, a value corresponding to an index for the first segment;
   receiving a request for the data; and
   outputting from the memory array, based at least in part on the request, the second plurality of bits and the value corresponding to the index for the first segment.

4. The method of claim 3, further comprising:
   identifying the value corresponding to the index for the first segment based at least in part on the outputting;
   inverting, for the second plurality of bits and based at least in part on the value, the first segment to obtain the second plurality of bits; and
   outputting, from the device, the second plurality of bits in response to the request for the data.

5. The method of claim 4, further comprising:
   inverting one or more additional segments each having a respective index that, according to an order of the plurality of indices, is greater than an index for the first segment, wherein the plurality of bits is obtained based at least in part on inverting the one or more additional segments.

6. The method of claim 1, wherein a third segment of the plurality of segments comprises padding bits, the method further comprising:
   determining that the second cumulative bit weight is within the range, wherein the data comprises a second plurality of bits after the first segment is inverted;
   determining, based at least in part on the second cumulative bit weight being within the range, a difference between a target bit weight and the second cumulative bit weight, the target bit weight equal to half of a total bit weight of the quantity of bits in the plurality of bits; and
   increasing or decreasing, based at least in part on the difference between the target bit weight and the second cumulative bit weight, a quantity of bits in a second segment associated with a first bit weight, wherein the data has the target bit weight based at least in part on the increasing or decreasing.

7. The method of claim 1, further comprising:
   determining that the second cumulative bit weight is outside of the range, wherein the data comprises a second plurality of bits after the first segment is inverted; and
   inverting, based at least in part on the second cumulative bit weight being outside of the range, a second segment of the plurality of segments in accordance with the plurality of indices, wherein the data has a third cumulative bit weight after the second segment is inverted, the third cumulative bit weight being within the range.

8. The method of claim 1, wherein the inverting is performed in accordance with an ordering of the plurality of indices, the ordering comprising:
  a consecutive ordering of the plurality of indices that comprises a single instance of each index of the plurality of indices, or
  a non-consecutive ordering of the plurality of indices that comprises a single instance of each index of the plurality of indices.

9. The method of claim 1, further comprising:
  configuring a span of the range to ensure that inverting at least a subset of the plurality of segments results in the data comprising an adjusted cumulative bit weight that is within the range.

10. The method of claim 9, wherein the span of the range is based at least in part on a quantity of bits included in each segment of the plurality of segments.

11. The method of claim 9, further comprising:
  shifting a bound of the range, wherein the range comprises a value equal to half of a total bit weight of the quantity of bits in the plurality of bits based at least in part on the shifting.

12. A method, comprising:
  receiving, for storage in a memory array, data that comprises a plurality of bits and is partitioned into a plurality of segments, wherein each bit of the plurality of bits is associated with a respective bit weight, and wherein a plurality of indices is assigned to the plurality of segments;
  determining that the data has a cumulative bit weight;
  determining that the cumulative bit weight is outside of a range that is based at least in part on a quantity of bits in the plurality of bits;
  inverting, based at least in part on the cumulative bit weight being outside of the range, one segment of the plurality of segments at a time in accordance with the plurality of indices and until the data comprises an adjusted plurality of bits associated with an adjusted cumulative bit weight, the adjusted cumulative bit weight being within the range; and
  writing the adjusted plurality of bits associated with the adjusted cumulative bit weight to the memory array based at least in part on the adjusted cumulative bit weight being within the range.

13. The method of claim 12, further comprising:
  determining, after each inversion of one segment of the plurality of segments, that the data has a respective cumulative bit weight; and
  comparing, after each inversion of one segment of the plurality of segments, the respective cumulative bit weight with the range, wherein a subsequent segment of the plurality of segments is inverted based at least in part on the respective cumulative bit weight being outside of the range.

14. The method of claim 12, further comprising:
  storing, in the memory array and based at least in part on the adjusted cumulative bit weight being within the range, an indication of an index for a last-inverted segment;
  receiving a request for the data; and
  outputting from the memory array, based at least in part on the request, the adjusted plurality of bits and the indication of the index for the last-inverted segment.

15. The method of claim 14, further comprising:
  inverting, for the adjusted plurality of bits, each segment of the plurality of segments having a respective index that, according to an order of the plurality of indices, matches or is earlier than the index for the last-inverted segment, wherein the plurality of bits is obtained based at least in part on the inverting; and
  outputting, from a device that includes the memory array, the plurality of bits in response to the request for the data.

16. The method of claim 12, further comprising:
  determining a span of the range based at least in part on a quantity of bits included in each segment of the plurality of segments, wherein inverting the plurality of segments in accordance with the plurality of indices results in cumulative bit weight being within the range based at least in part on the span of the range.

17. An apparatus, comprising:
  a memory array; and
  a controller for the memory array and operable to cause the apparatus to:
    receive data that comprises a plurality of bits and is partitioned into a plurality of segments, wherein each bit of the plurality of bits is associated with a respective bit weight, and wherein a plurality of indices is assigned to the plurality of segments;
    determine that the data comprises a first cumulative bit weight, the first cumulative bit weight being outside of a range that is based at least in part on a quantity of bits in the plurality of bits; and
    invert, based at least in part on the first cumulative bit weight the range, a first segment of the plurality of segments in accordance with the plurality of indices, wherein the data has a second cumulative bit weight after the first segment is inverted.

18. The apparatus of claim 17, wherein the controller is further operable to cause the apparatus to:
  determine that the second cumulative bit weight is within the range, wherein the data comprises a second plurality of bits after the first segment is inverted; and
  store the second plurality of bits in the memory array based at least in part on the second cumulative bit weight being within the range.

19. The apparatus of claim 18, wherein the controller is further operable to cause the apparatus to:
  store, in the memory array, a value corresponding to an index for the first segment;
  receive a request for the data; and
  output from the memory array, based at least in part on the request, the second plurality of bits and the value corresponding to the index for the first segment.

20. The apparatus of claim 19, wherein the controller is further operable to cause the apparatus to:
  identify the value corresponding to the index for the first segment based at least in part on the outputting;
  inverting, for the second plurality of bits and base at least in part on the value, the first segment to obtain the second plurality of bits; and
  output the second plurality of bits in response to the request for the data.

* * * * *